(12) United States Patent
Lee et al.

(10) Patent No.: US 10,847,565 B2
(45) Date of Patent: *Nov. 24, 2020

(54) BACK SIDE ILLUMINATION IMAGE SENSORS HAVING AN INFRARED FILTER

(71) Applicant: Samsung Electronics Co., Ltd., Suwon-si (KR)

(72) Inventors: Yun Ki Lee, Hwaseong-si (KR); Jong Hoon Park, Hwaseong-si (KR); Jun Sung Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/433,515

(22) Filed: Jun. 6, 2019

(65) Prior Publication Data

US 2020/0203403 A1 Jun. 25, 2020

(30) Foreign Application Priority Data

Dec. 20, 2018 (KR) .................. 10-2018-0165935

(51) Int. Cl.
*H01L 27/146* (2006.01)

(52) U.S. Cl.
CPC .... *H01L 27/1464* (2013.01); *H01L 27/14621* (2013.01); *H01L 27/14643* (2013.01)

(58) Field of Classification Search
CPC ........... H01L 27/1464; H01L 27/14643; H01L 27/14621
See application file for complete search history.

(56) References Cited

U.S. PATENT DOCUMENTS

| | | | |
|---|---|---|---|
| 9,679,933 B2 | 6/2017 | Huang et al. | |
| 10,177,191 B1 | 1/2019 | Cheng et al. | |
| 2015/0221691 A1 | 8/2015 | Watanabe | |
| 2016/0204151 A1 | 7/2016 | Godaiin | |
| 2017/0017824 A1 | 1/2017 | Smith et al. | |
| 2017/0083745 A1 | 3/2017 | Goodelle et al. | |
| 2017/0109564 A1 | 4/2017 | Seo et al. | |
| 2017/0220844 A1 | 8/2017 | Jones et al. | |
| 2018/0081098 A1 | 3/2018 | Smith et al. | |
| 2020/0035729 A1* | 1/2020 | Lee | H01L 27/14645 |
| 2020/0127042 A1* | 4/2020 | Lin | H01L 27/14627 |
| 2020/0176497 A1* | 6/2020 | Kim | H01L 27/14623 |
| 2020/0219913 A1* | 7/2020 | Lee | H04N 5/36961 |

FOREIGN PATENT DOCUMENTS

| | | |
|---|---|---|
| JP | 2008051877 | 3/2008 |
| JP | 2008060320 | 3/2008 |
| KR | 1020060062461 | 6/2006 |
| KR | 1020160123000 | 10/2016 |

* cited by examiner

*Primary Examiner* — Matthew E. Gordon
(74) *Attorney, Agent, or Firm* — Myers Bigel, P.A.

(57) ABSTRACT

Back side illumination (BSI) image sensors are provided. A BSI image sensor includes a substrate and a plurality of pixels configured to generate electrical signals responsive to light incident on the substrate. Each of the plurality of pixels includes a photodiode, an infrared radiation (IR) cut-off filter above the photodiode, a light shield pattern above the photodiode and including an opening corresponding to an area of 1 to 15% of each of the plurality of pixels, a planarization layer on the light shield pattern, and a lens on the planarization layer.

20 Claims, 13 Drawing Sheets

BACK SIDE ILLUMINATION IMAGE SENSORS HAVING AN INFRARED FILTER

CROSS-REFERENCE TO RELATED APPLICATION

This application claims priority from Korean Patent Application No. 10-2018-0165935, filed on Dec. 20, 2018, the disclosure of which is incorporated herein by reference in its entirety.

BACKGROUND

The present disclosure relates to back side illumination (BSI) image sensors. An image sensor is a device for converting light into an electrical signal. Recently, with the development of computer and communication industries, image sensors having improved performance are desirable in various fields including camcorders, game machines, digital cameras, display devices, mobile phones (e.g., smart phones), and the like. Conventionally, front side illumination (FSI) image sensors are mainly used. The FSI image sensors have disadvantages in that light reception efficiency is degraded because lines are disposed on photodiodes. Recently, back side illumination (BSI) image sensors have been developed for reducing the disadvantages of such FSI image sensors.

SUMMARY

Some example embodiments of the inventive concepts are directed to providing a back side illumination (BSI) image sensor embedding an infrared rays/radiation (IR) cut-off filter.

In addition, some example embodiments of the inventive concepts are directed to providing a BSI image sensor module of which manufacturing efficiency is improved by embedding an IR cut-off filter inside an image sensor.

Further, some example embodiments of the inventive concepts are directed to providing a BSI image sensor module of which a thickness and a manufacturing cost are reduced by embedding an IR cut-off filter into an image sensor.

Furthermore, some example embodiments of the inventive concepts are directed to providing an electronic device including a BSI image sensor with an IR cut-off filter.

Additionally, some example embodiments of the inventive concepts are directed to providing an electronic device including an image sensor of which a thickness is reduced.

According to example embodiments, there is provided a BSI image sensor including a substrate and a plurality of pixels configured to generate electrical signals responsive to light incident on the substrate. Each of the plurality of pixels may include a photodiode, a device isolation region around the photodiode, a dark current suppression layer above the photodiode, an infrared radiation (IR) cut-off filter above the photodiode, a light shield pattern above the photodiode and including an opening corresponding to an area of 1 to 15% of each of the plurality of pixels, a light cut-off filter layer on the light shield pattern except for the opening, a planarization layer on the light cut-off filter layer, and a lens on the planarization layer.

According to example embodiments, there is provided a BSI image sensor including a substrate and a plurality of pixels configured to generate electrical signals responsive to light incident on a back side of the substrate. Each of the plurality of pixels may include a photodiode, a dark current suppression layer above the photodiode and including a stack of a plurality of layers that each have a negative charge, an infrared radiation (IR) cut-off filter above the photodiode and including a stack of a plurality of refractive index films, a light shield pattern above the photodiode and including an opening corresponding to an area of 1 to 15% of each of the plurality of pixels, a planarization layer on the light shield pattern, and a lens on the planarization layer.

According to example embodiments, there is provided a BSI image sensor including a substrate and a plurality of pixels configured to generate electrical signals responsive to light incident on a back side of the substrate. The BSI image sensor may include a plurality of readout circuits configured to readout the electrical signals of the plurality of pixels. Moreover, each of the plurality of pixels may include a photodiode, an infrared radiation (IR) cut-off filter above the photodiode, a light shield pattern above the photodiode and including an opening corresponding to an area of 1 to 15% of each of the plurality of pixels, a planarization layer on the light shield pattern, and a lens on the planarization layer.

DETAILED DESCRIPTION

Hereinafter, an image sensor with an infrared rays/radiation (IR) cut-off filter and an electronic device including the same according to example embodiments of the inventive concept will be described with reference to the accompanying drawings.

Figure 1:
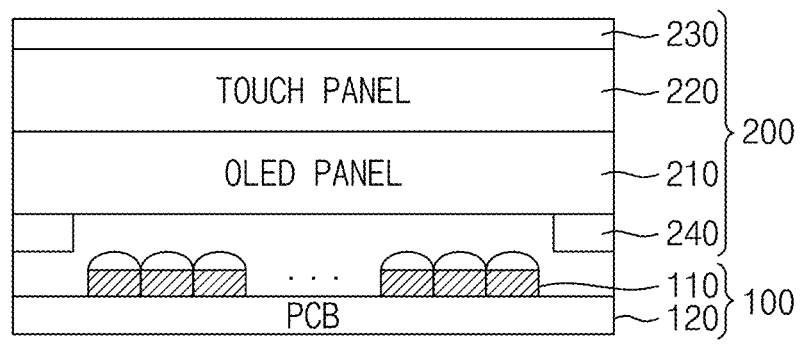
FIG. 1 is a diagram illustrating an electronic device including an image sensor with an IR cut-off filter according to some example embodiments of the inventive concepts.
Figure 2A:
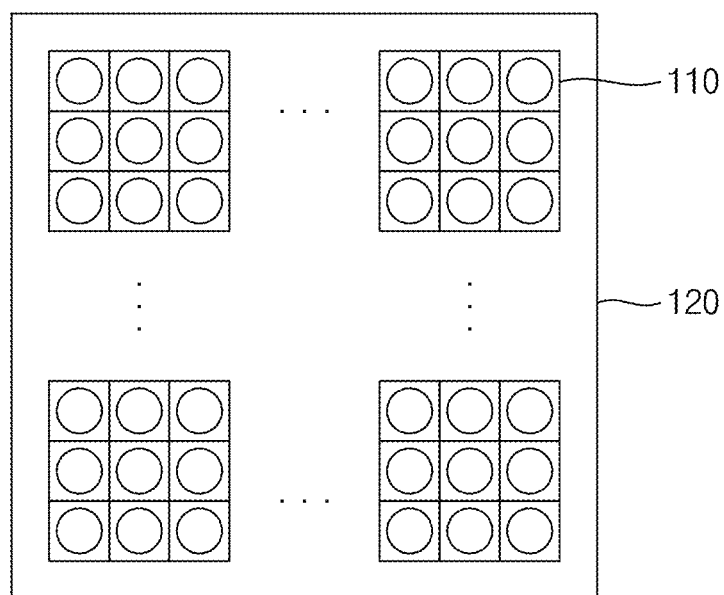
FIG. 2A is a diagram illustrating the image sensor according to some example embodiments of the inventive concepts.

FIG. 1 is a diagram illustrating an electronic device including an image sensor with an IR cut-off filter according to some example embodiments of the inventive concepts. FIG. 2A is a diagram illustrating the image sensor according to some example embodiments of the inventive concepts.

Referring to FIGS. 1 and 2A, an electronic device 10 according to some example embodiments of the inventive concepts may include an image sensor 100 having an IR cut-off filter and a display module 200. The display module 200 for displaying an image may be disposed in an upper portion of the electronic device 10, and the image sensor 100 may be disposed below the display module 200. The display module 200 may include an organic light emitting diode (OLED) panel 210 as a display panel for displaying an image. The display module 200 may include a touch panel 220 for sensing a user's touch. The touch panel 220 may be disposed on the OLED panel 210. The display module 200 may include a protection film 230 disposed on the touch panel 220 and a cushion part 240 for cushioning an impact applied when a user touches.

The OLED panel 210 is configured to display an image on the basis of an input image signal and may display the image through self-emission without a backlight. The OLED panel 210 does not require a backlight, and therefore a thickness of the OLED panel 210 can be small. The touch panel 220 may use sensors provided on a surface of the touch panel 220 to detect a touch input by converting a state change, such as a pressure change applied to the surface, a capacitance change, or a change in quantity of light, into an electrical signal. In FIG. 1, an example in which the OLED panel 210 is applied as a display panel is illustrated. The inventive concepts are not limited thereto, and other kinds of display panels capable of transmitting light may be applied in addition to the OLED panel 210.

The touch panel 220 may be implemented as a resistive type, a capacitance type, a surface acoustic wave type, or an infrared (IR) type. The protection film 230 is disposed on a front surface of the touch panel 220 and may be formed to have a predetermined thickness to protect the front surface of the touch panel 220. The protection film 230 may prevent/impede reflection of light incident on the touch panel 220 from outside of the electronic device 10.

The image sensor 100 may include a plurality of pixels 110 disposed in one-dimensional or two-dimensional array and a printed circuit board (PCB) 120 on which a processor and a drive circuit are disposed for driving the plurality of pixels 110. Each of the plurality of pixels 110 may be formed in a chip shape, and the plurality of chip-shaped pixels 110 may be disposed on the PCB 120. Chip-shaped unit pixels may be gathered to constitute a pixel array, and the pixel array may be disposed on the PCB 120.

For example, a complementary metal-oxide semiconductor (CMOS) image sensor (CIS) may be applied to the image sensor 100. The image sensor 100 is configured to convert received light into an electrical signal and may generate a sensed signal when a finger makes contact so as to output the sensed signal to the processor. The processor may generate a fingerprint image on the basis of the sensed signal received from the image sensor 100.

The electronic device 10 according to some example embodiments of the inventive concepts may be a device including a communication function. For example, the electronic device 10 may be one among a smartphone, a tablet personal computer (PC), a mobile phone, a wearable device (e.g., a smart watch), an e-book, a notebook computer, a netbook computer, a personal digital assistant (PDA), a portable multimedia player (PMP), a mobile medical device, and a digital camera.

Figure 2B:
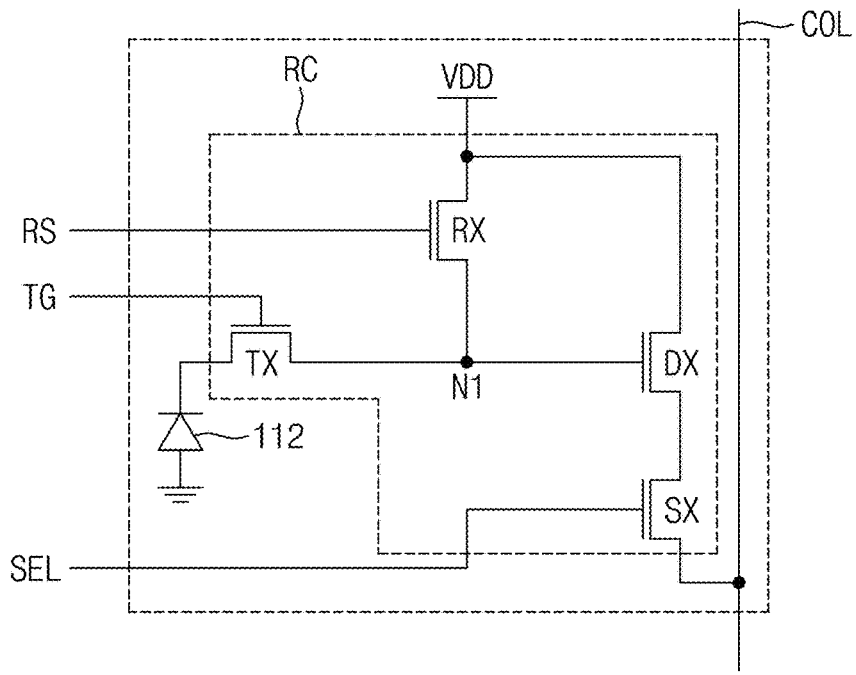
FIG. 2B is a circuit diagram of a unit pixel constituting the pixel array.

FIG. 2B is a circuit diagram of a unit pixel constituting the pixel array.

Referring to FIG. 2B, each of the plurality of pixels 110 may include a photodiode 112 that is an optical sensor and a plurality of transistors TX, RX, DX, and SX for a readout circuit (RC). The RC may drive the photodiode 112 and readout an electrical signal generated by the photodiode 112. The RC may include a transfer transistor TX, a driving transistor DX, a selection transistor SX, and a reset transistor RX.

Electrical charges generated at the photodiode 112 may be output to a first node N1 via the transfer transistor TX. For example, when a transfer control signal TG is at a first level (e.g., high level), the transfer transistor TX may be turned on. When the transfer transistor TX is turned on, the electrical charges generated at the photodiode 112 may be output to the first node N1 via the transfer transistor TX.

For example, the driving transistor DX may operate as a source follower buffer amplifier. The driving transistor DX may amplify a signal corresponding to the charges charged at the first node N1.

For example, the selection transistor SX may be turned on in response to a selection signal SEL. When the selection transistor SX is turned on, the signal amplified by the driving transistor DX may be transmitted to a column line COL.

For example, the reset transistor RX may be disposed between a VDD terminal and the first node N1. The reset transistor RX may be turned on in response to a reset signal RS. When the reset transistor RX is turned on, the charges charged at the first node N1 may be reset to the VDD voltage level. FIG. 2B shows a pixel 110 including a single photodiode 112 and four metal oxide semiconductor (MOS) transistors TX, RX, DX, and SX. The inventive concepts are not limited thereto, and each of the pixels 110 may be constituted of a single photodiode 112 and three or less MOS transistors or a single photodiode 112 and five or more MOS transistors.

Figure 3A:
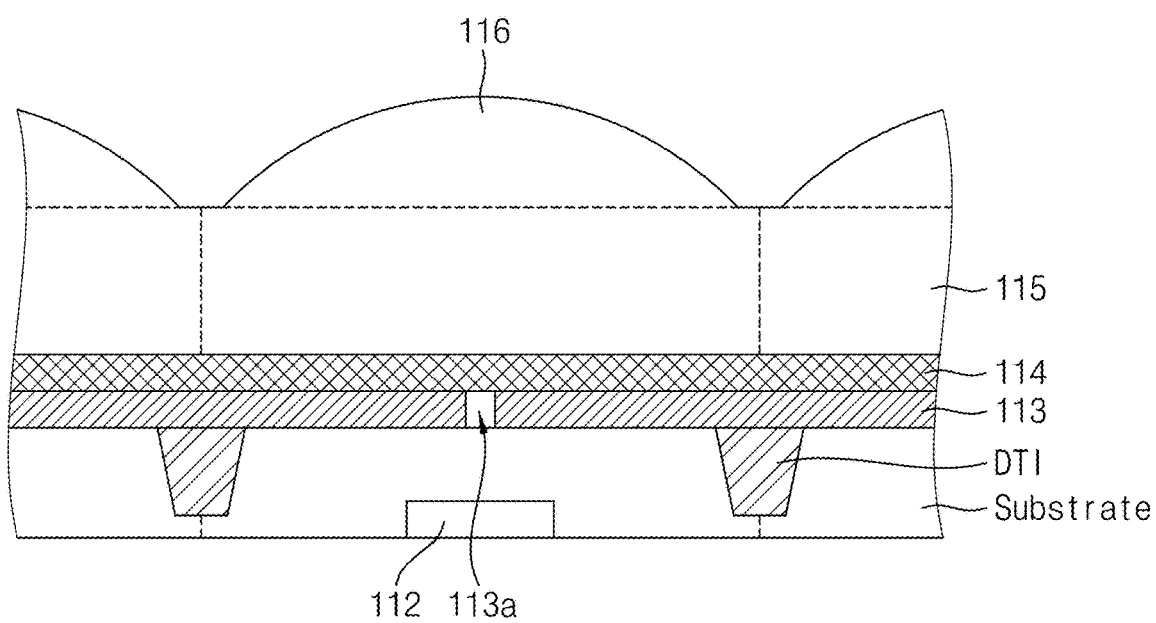
FIG. 3A shows a pixel of an image sensor according to some example embodiments of the inventive concepts and is a diagram illustrating an IR cut-off filter disposed on a light shield grid.

FIG. 3A shows a pixel of an image sensor according to some example embodiments of the inventive concepts and is a diagram illustrating an IR cut-off filter disposed on a light shield grid.

Referring to FIG. 3A, each of the plurality of pixels 110 may include the photodiode 112, a light shield grid (e.g., a light shield pattern/layer) 113, a device isolation portion (e.g., device isolation region or device isolation film) DTI, an IR cut-off filter 114, a planarization layer 115, and a lens 116.

The photodiode 112 is configured to receive light to generate optical charges and may be formed on a silicon substrate. The plurality of transistors TX, RX, DX, and SX (see FIG. 2B) may be disposed and spaced apart from the photodiode 112 on a layer on which the photodiode 112 is disposed or may be disposed on a layer different from the layer on which the photodiode 112 is disposed. Interconnection lines connecting the photodiode 112 to the transistors TX, RX, DX, and SX (see FIG. 2B) may be disposed below the photodiode 112. The photodiode 112 may be disposed on a back side of the silicon substrate, and the interconnection lines may be disposed on a front side of the silicon substrate that is opposite the back side.

During a manufacturing process of the image sensor 100, the back side of the silicon substrate is polished to have a thickness (e.g., 3 micrometers (μm)) through which light may transmit such that the photodiode 112 may be formed on the back side of the silicon substrate. The transistors TX, RX, DX, and SX and the interconnection lines are formed on the front side of the silicon substrate. Then, the light shield grid 113, the IR cut-off filter 114, the planarization layer 115, and the lens 116 may be disposed above the photodiode 112.

The lens 116 may be disposed at each of the pixels 110. The lens 116 may be formed in a cylindrical shape or a hemispherical shape so as to collect incident light at one point. Consequently, light may be collected at the photodiode 112 through the back side of the silicon substrate. In a back side illumination (BSI) image sensor 100, the interconnection lines are disposed below the photodiode 112 (on the front side of the silicon substrate) such that the incident light is not hindered by the interconnection lines. Thus, the BSI image sensor 100 may collect a wide angle of light on the photodiode 112.

The IR cut-off filter 114 is configured to prevent/reduce a photoelectric effect due to IRs out of a visible ray range and may be disposed between the planarization layer 115 and the light shield grid 113. The IR cut-off filter 114 may be disposed on a front side of each of the plurality of pixels 110. The light shield grid 113 including an opening 113a may be disposed below the IR cut-off filter 114 so as to allow light to be incident on the photodiode 112.

The device isolation portion (e.g., device isolation region or device isolation film) DTI having a predetermined depth may be disposed between the pixels 110. The device isolation portion DTI is configured to reduce interference between the pixels 110 and may be disposed around (e.g., to surround) each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

Light generated from the OLED panel 210 may be reflected by a finger and be incident on each of the pixels 110 of the image sensor 100. Light may pass through the lens 116, the planarization layer 115, and the infrared rays/radiation (IR) cut-off filter 114 and be incident on the photodiode 112 through the opening 113a formed by the light shield grid 113. For example, the opening 113a may vertically overlap a portion of the photodiode 112. Light having a wavelength range corresponding to an IR range may be blocked by the IR cut-off filter 114.

FIGS. 4A to 4D are diagrams illustrating examples in which a high refractive index film and a low refractive index film are stacked to form the IR cut-off filter 114.

Figure 4A:
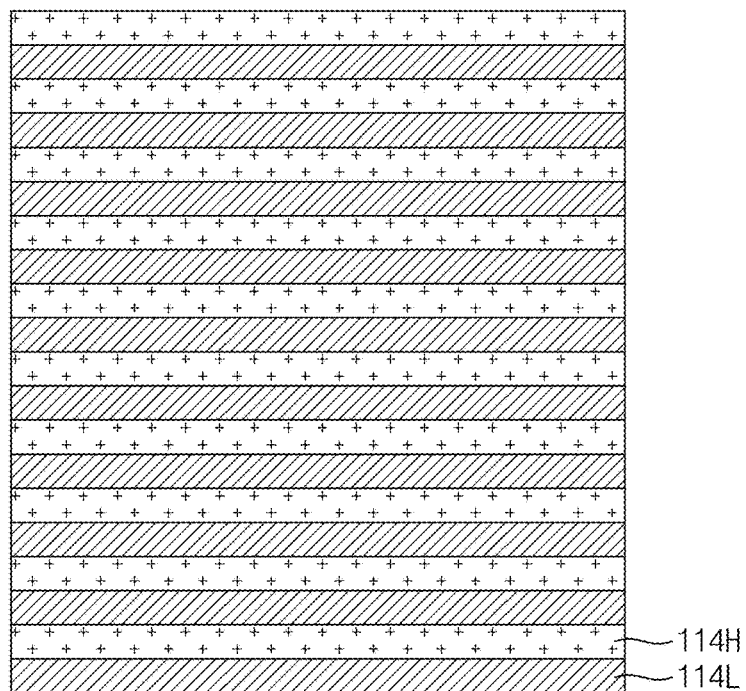
FIGS. 4A to 4D are diagrams illustrating examples in which a high refractive index film and a low refractive index film are stacked to form the IR cut-off filter.

Referring to FIGS. 3A and 4A, the IR cut-off filter 114 may be formed by alternately stacking different kinds of film to cut-off (i.e., to block/impede) IRs.

For example, the IR cut-off filter 114 may be constituted of a plurality of layers formed by a low refractive index film 114L having a first refractive index and a high refractive index film 114H having a second refractive index that is higher than the first refractive index being alternately stacked. The IR cut-off filter 114 may be constituted such that ten or more low refractive index films 114L and ten or more high refractive index films 114H are alternately disposed. The IR cut-off filter 114 may be constituted by stacking ten or more pairs of the low refractive index film 114L and the high refractive index film 114H.

The high refractive index film 114H may be disposed at an uppermost layer of the IR cut-off filter 114. The low refractive index film 114L may be disposed on a lowermost layer of the IR cut-off filter 114. The high refractive index film 114H may be disposed below the planarization layer 115, and the low refractive index film 114L may be disposed above the light shield grid 113. A plurality of low refractive index films 114L may have the same refractive index. A plurality of high refractive index films 114H may have the same refractive index. The plurality of low refractive index films 114L may have any one refractive index in the range of 1.2 to 1.8. The plurality of high refractive index films 114H may have any one refractive index in the range of 2.0 to 2.8.

The plurality of low refractive index films 114L may be formed with the same thickness. For example, the plurality of low refractive index films 114L may be formed with a thickness of 80 to 160 nm (800 Å to 1,600 Å). The plurality of high refractive index films 114H may be formed with the same thickness. For example, the plurality of high refractive index films 114H may be formed with a thickness of 80 to 160 nm (800 Å to 1,600 Å).

The inventive concepts are not limited thereto, and the plurality of low refractive index films 114L may be formed with different thicknesses. For example, the plurality of low refractive index films 114L may have different thicknesses in the range of 80 to 160 nm (800 Å to 1,600 Å). The plurality of high refractive index films 114H may be formed with different thicknesses. For example, the plurality of high refractive index films 114H may have different thicknesses within the range of 80 to 160 nm (800 Å to 1,600 Å).

Each of the high refractive index film 114H and the low refractive index film 114L of the IR cut-off filter 114 may be formed of an oxide or a nitride. Each of the high refractive index film 114H and the low refractive index film 114L of the IR cut-off filter 114 may be formed of a combination of an oxide, a nitride, and a polymer of a transparent material.

For example, each of the high refractive index film 114H and the low refractive index film 114L may be formed of one material among titanium oxide (TiO), tantalum oxide (TaO), hafnium oxide (HfO), lanthanum oxide (LaO), zirconium oxide (ZrO), aluminum oxide (AlO), silicon oxide (SiO$_2$), silicon nitride (SiN), silicon oxynitride (SiON), and a polymer of a transparent material, or a combination of two or more materials thereamong. The high refractive index film 114H may be formed of one oxide, one nitride, or one polymer. The high refractive index film 114H may be formed of a combination of two or more materials among an oxide, a nitride, and a polymer. The low refractive index film 114L may be formed of one oxide, one nitride, or one polymer. The low refractive index film 114L may be formed of a combination of two or more materials among an oxide, a nitride, and a polymer.

Figure 4B:
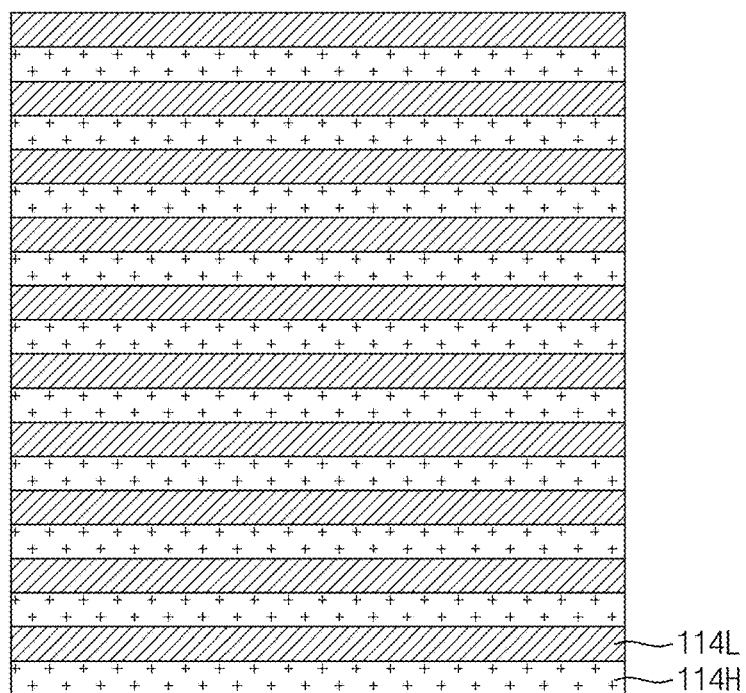

Referring to FIGS. 1, 3A, and 4B, the IR cut-off filter 114 may be constituted of a plurality of layers formed by the low refractive index film 114L having a first refractive index and the high refractive index film 114H having a second refractive index that is higher than the first refractive index being alternately stacked.

The low refractive index film 114L may be disposed on the uppermost layer of the IR cut-off filter 114. The high refractive index film 114H may be disposed at the lowermost layer of the IR cut-off filter 114. The low refractive index film 114L may be disposed below the planarization layer 115, and the high refractive index film 114H may be disposed above the light shield grid 113. A plurality of low refractive index films 114L may have the same refractive index. A plurality of high refractive index films 114H may have the same refractive index. The plurality of low refractive index films 114L may have any one refractive index in the range of 1.2 to 1.8. The plurality of high refractive index films 114H may have any one refractive index in the range of 2.0 to 2.8.

FIGS. 4A and 4B illustrate examples of the IR cut-off filter 114 in which ten pairs of the low refractive index film 114L and the high refractive index film 114H are stacked. The inventive concepts are not limited thereto, and the IR cut-off filter 114 may be constituted of nine pairs or fewer of the low refractive index film 114L and the high refractive index film 114H. The IR cut-off filter 114 may be constituted of 11 to 20 pairs of the low refractive index film 114L and the high refractive index film 114H.

Figure 4C:
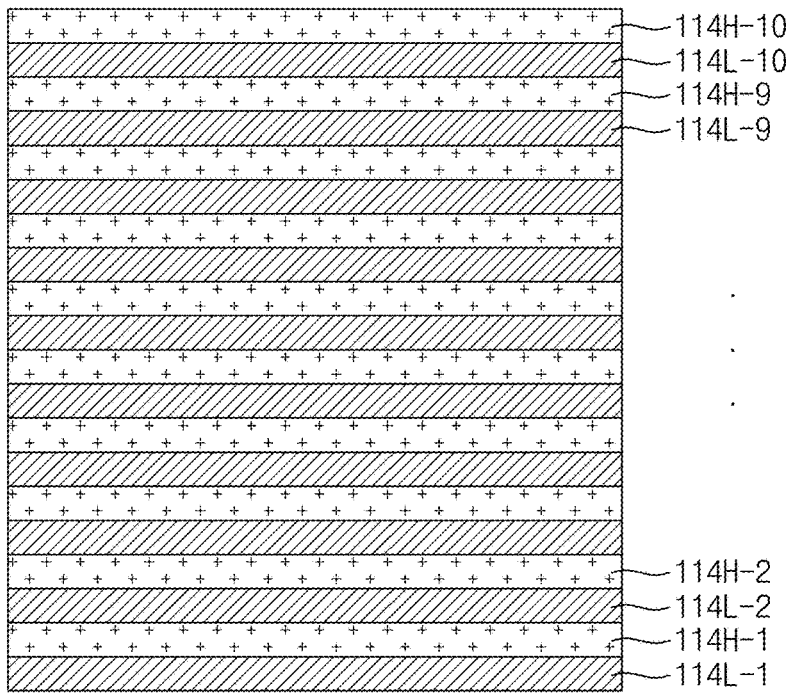

Referring to FIGS. 3A and 4C, the IR cut-off filter 114 may be constituted of a plurality of layers formed by a plurality of low refractive index films 114L-1 to 114L-10 and a plurality of high refractive index films 114H-1 to 114H-10 being alternatively stacked. A tenth high refractive index film 114H-10 may be disposed on/as the uppermost layer of the IR cut-off filter 114. A first low refractive index film 114L-1 may be disposed on/as the lowermost layer of the IR cut-off filter 114.

The IR cut-off filter 114 may be constituted such that ten or more low refractive index films 114L and ten or more high refractive index films 114H are alternately disposed. FIG. 4C shows an example in which the IR cut-off filter 114 may be constituted by stacking ten or more pairs of the low refractive index film 114L and the high refractive index film 114H.

For example, the first low refractive index film 114L-1 may be disposed on the light shield grid 113, and a first high refractive index film 114H-1 may be disposed on the first low refractive index film 114L-1. A second low refractive index film 114L-2 having a refractive index different from that of the first low refractive index film 114L-1 may be disposed on the first high refractive index film 114H-1. A second high refractive index film 114H-2 having a refractive index different from that of the first high refractive index film 114H-1 may be disposed on the second low refractive index film 114L-2. A third low refractive index film 114L-3 having a refractive index different from that of the second low refractive index film 114L-2 may be disposed on the second high refractive index film 114H-2. A third high refractive index film 114H-3 having a refractive index different from that of the second high refractive index film 114H-2 may be disposed on the third low refractive index film 114L-3.

Similarly, fourth to tenth low refractive index films and fourth to tenth high refractive index films may be alternately stacked. As described above, ten pairs of the low refractive index film and the high refractive index film are alternately stacked to constitute the IR cut-off filter 114.

All of the first low refractive index film 114L-1 to the tenth low refractive index film 114L-10 may have different refractive indexes. Alternatively, some of the first low refractive index film 114L-1 to the tenth low refractive index film 114L-10 may have the same refractive index, whereas the remaining thereof may have different refractive indexes.

The IR cut-off filter 114 may be constituted by stacking a plurality of high and low refractive index films 114L-1 to 114L-10 and 114H-1 to 114H-10 having different refractive indexes.

For example, each of low refractive index films 114L-1 to 114L-10 disposed on/as odd-numbered layers among the plurality of refractive index films 114L-1 to 114H-10 constituting the IR cut-off filter 114 may have a refractive index in the range of 1.2 to 1.8. Each of high refractive index films 114H-1 to 114H-10 disposed on/as even-numbered layers among the plurality of refractive index films 114L-1 to 114H-10 constituting the IR cut-off filter 114 may have a refractive index in the range of 2.0 to 2.8.

Alternatively, each of high refractive index films 114H-1 to 114H-10 disposed on/as odd-numbered layers among the plurality of refractive index films 114L-1 to 114H-10 constituting the IR cut-off filter 114 may have a refractive index in the range of 2.0 to 2.8. Each of low refractive index films 114L-1 to 114L-10 disposed on/as even-numbered layers among the plurality of refractive index films 114L-1 to 114H-10 constituting the IR cut-off filter 114 may have a refractive index in the range of 1.2 to 1.8.

The plurality of low refractive index films 114L-1 to 114L-10 may have different refractive indexes in the range of 1.2 to 1.8. For example, the second low refractive index film 114L-2 may have a refractive index that is higher than that of the first low refractive index film 114L-1. The third low refractive index film 114L-3 may have a refractive index that is higher than that of the second low refractive index film 114L-2. Similarly, the fourth to tenth low refractive index films 114L-4 to 114L-10 may have different refractive indexes.

The plurality of high refractive index films 114H-1 to 114H-10 may have different refractive indexes in the range of 2.0 to 2.8. For example, the second high refractive index film 114H-2 may have a refractive index that is higher than that of the first high refractive index film 114H-1. The third high refractive index film 114H-3 may have a refractive index that is higher than that of the second high refractive index film 114H-2. Similarly, the fourth to tenth high refractive index films 114H-4 to 114H-10 may have different refractive indexes.

As described above, a pair of the low refractive index film and the high refractive index film may be formed, and ten pairs or more of the low refractive index films and the high refractive index films may be alternately disposed to constitute the IR cut-off filter 114.

For example, the refractive indexes of the first to tenth high refractive index films 114H-1 to 114H-10 constituting the IR cut-off filter 114 may become lower in a direction from a side at which light is incident toward the photodiode 112.

Moreover, the refractive indexes of the first to tenth low refractive index films 114L-1 to 114L-10 constituting the IR cut-off filter 114 may become lower in the direction from the side at which the light is incident toward the photodiode 112.

In some embodiments, the refractive indexes of the first to tenth high refractive index films 114H-1 to 114H-10 constituting the IR cut-off filter 114 may become higher in the direction from the side at which the light is incident toward the photodiode 112.

Moreover, the refractive indexes of the first to tenth low refractive index films 114L-1 to 114L-10 constituting the IR cut-off filter 114 may become higher in the direction from the side at which the light is incident toward the photodiode 112.

The first to tenth low refractive index films 114L-1 to 114L-10 may be formed with the same thickness. For example, the first to tenth low refractive index films 114L-1 to 114L-10 may be formed with a thickness of 80 nm to 160 nm (800 Å to 1,600 Å).

The first to tenth high refractive index films 114H-1 to 114H-10 may be formed with the same thickness. For example, the first to tenth high refractive index films 114H-1 to 114H-10 may be formed with a thickness of 80 nm to 160 nm (800 Å to 1,600 Å).

The inventive concepts are not limited thereto, the first to the tenth low refractive index films 114L-1 to 114L-10 may be formed with different thicknesses. For example, the first to tenth low refractive index films 114L-1 to 114L-10 may have different thicknesses in the range of 80 nm to 160 nm (800 Å to 1,600 Å).

The first to tenth high refractive index films 114H-1 to 114H-10 may be formed with different thicknesses. For example, the first to tenth high refractive index films 114H-1 to 114H-10 may have different thicknesses in the range of 80 nm to 160 nm (800 Å to 1,600 Å).

Figure 4D:
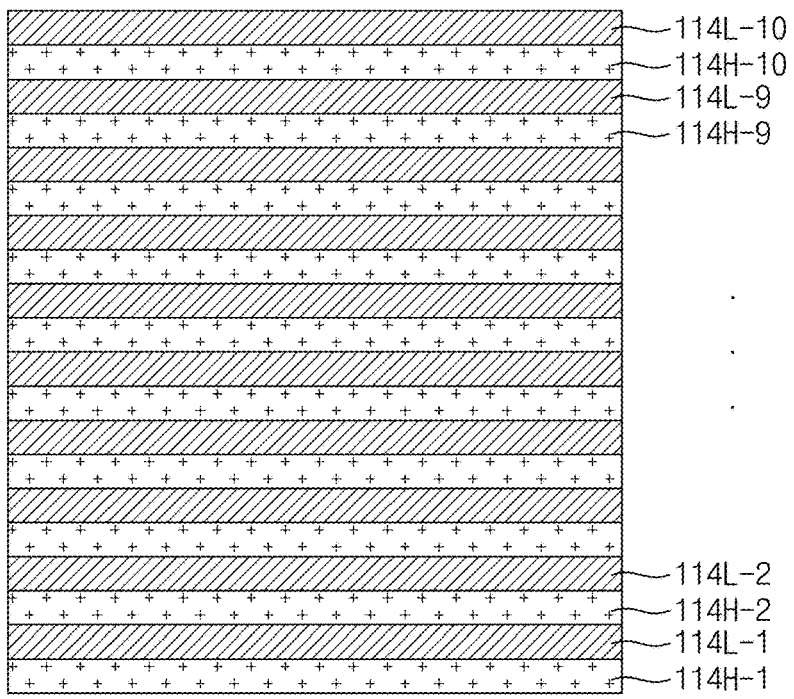

Referring to FIGS. 3A and 4D, the IR cut-off filter 114 may be constituted of a plurality of layers formed by a plurality of low refractive index films 114L-1 to 114L-10 and a plurality of high refractive index films 114H-1 to 114H-10 being alternatively stacked. A tenth low refractive index film 114L-10 may be disposed on/as the uppermost layer of the IR cut-off filter 114. A first high refractive index film 114H-1 may be disposed on/as the lowermost layer of the IR cut-off filter 114.

The first high refractive index film 114H-1 may be disposed on the light shield grid 113, and a first low refractive index film 114L-1 may be disposed on the first high refractive index film 114H-1. A second high refractive index film 114H-2 having a refractive index different from that of the first high refractive index film 114H-1 may be disposed on the first low refractive index film 114L-1. A second low refractive index film 114L-2 having a refractive index different from that of the first low refractive index film 114L-1 may be disposed on the second high refractive index film 114H-2. A third high refractive index film 114H-3 having a refractive index different from that of the second high refractive index film 114H-2 may be disposed on the second low refractive index film 114L-2. A third low refractive index film 114L-3 having a refractive index different from that of the second low refractive index film 114L-2 may be disposed on the third high refractive index film 114H-3. Similarly, the fourth to tenth low refractive index films 114L-4 to 114L-10 may have different refractive indexes. As described above, a pair of the low refractive index film and the high refractive index film may be formed, and ten or more pairs of the low refractive index films and the high refractive index films may be alternately disposed to constitute the IR cut-off filter 114.

For example, the plurality of low refractive index films 114L-1 to 114L-10 may have different refractive indexes in the range of 1.2 to 1.8. The plurality of high refractive index films 114H-1 to 114H-10 may have different refractive indexes in the range of 2.0 to 2.8.

For example, the refractive indexes of the first to tenth high refractive index films 114H-1 to 114H-10 constituting the IR cut-off filter 114 may become lower in a direction from a side at which light is incident toward the photodiode 112.

Moreover, the refractive indexes of the first to tenth low refractive index films 114L-1 to 114L-10 constituting the IR cut-off filter 114 may become lower in the direction from the side at which the light is incident toward the photodiode 112.

In some embodiments, the refractive indexes of the first to tenth high refractive index films 114H-1 to 114H-10 constituting the IR cut-off filter 114 may become higher in the direction from the side at which the light is incident toward the photodiode 112.

Moreover, the refractive indexes of the first to tenth low refractive index films 114L-1 to 114L-10 constituting the IR cut-off filter 114 may become higher in the direction from the side at which the light is incident toward the photodiode 112.

FIGS. 4C and 4D illustrate examples of the IR cut-off filter 114 in which ten pairs of the low refractive index films and the high refractive index films are stacked. The inventive concepts are not limited thereto, and the IR cut-off filter 114 may be constituted of nine pairs or fewer of the low refractive index films and the high refractive index films. The IR cut-off filter 114 may be constituted of 11 to 20 pairs of the low refractive index films and the high refractive index films.

Figure 5A:
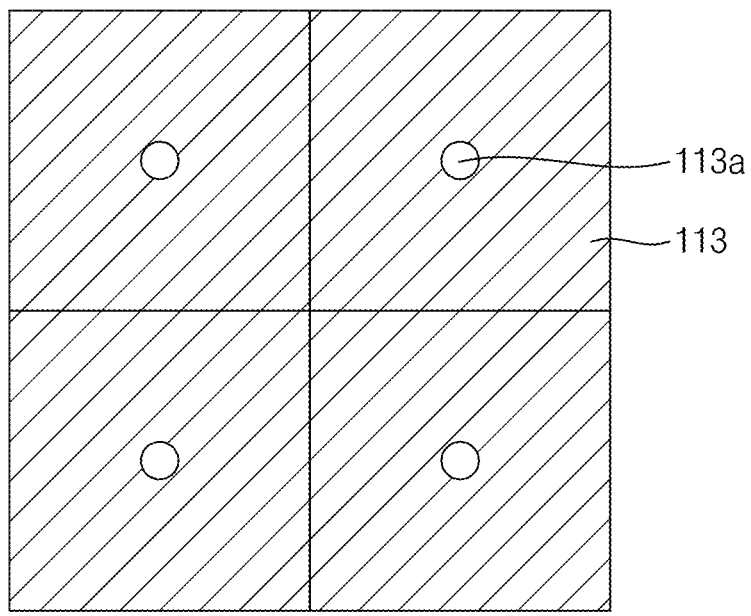
FIGS. 5A and 5B are diagrams illustrating a light shield grid of the image sensor of the inventive concept.
Figure 5B:
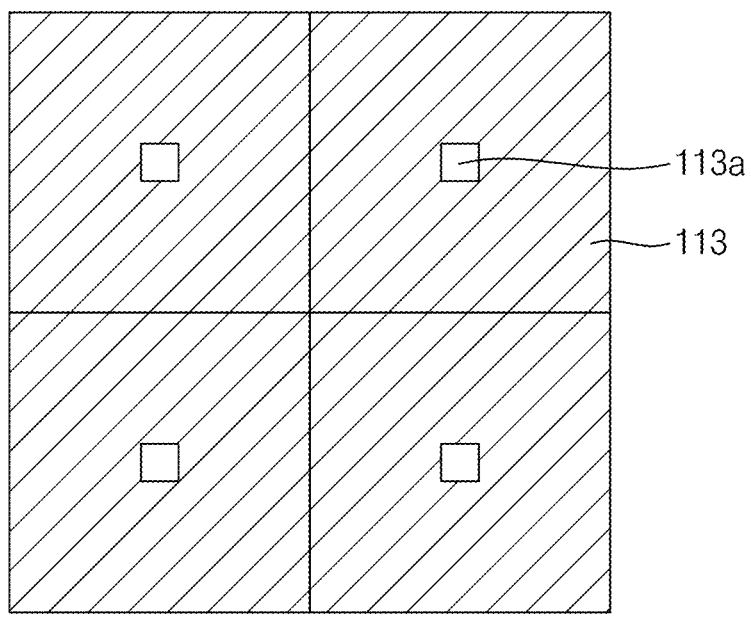

FIGS. 5A and 5B are diagrams illustrating a light shield grid of the image sensor of the inventive concept.

As shown in FIG. 5A, the light shield grid 113 may be formed to have a circular opening 113a.

As shown in FIG. 5B, the light shield grid 113 may be formed to have a quadrangular opening 113a.

The light shield grid 113 may be formed of a metal material such as tungsten (W). The image sensor 100 of the inventive concepts is configured to generate a fingerprint image of a finger, and the opening 113a of the light shield grid 113 may be formed to be very small. Light may be guided to be incident on the photodiode 112 by the opening 113a of the light shield grid 113. The opening 113a of the light shield grid 113 may be disposed to correspond to a central portion of the pixel 110. The opening 113a of the light shield grid 113 may be disposed to correspond to a central portion of the photodiode 112. Light may be incident on the photodiode 112 of each of the pixels 110 without passing over another pixel 110 by the opening 113a disposed to correspond to each of the pixels 110. The opening 113a may include (e.g., may be filled with) a transparent layer formed of a transparent material.

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The planarization layer 115 may be formed to cover the IR cut-off filter 114. An upper surface on which the lens 116 is disposed may be planarized by the planarization layer 115. For example, the planarization layer 115 may be formed of a single film selected from the group consisting of an oxide film, a nitride film, and an oxynitride film. Alternatively, the planarization layer 115 may be formed of two or more stacked films selected from the group consisting of an oxide film, a nitride film, and an oxynitride film.

Figure 3B:
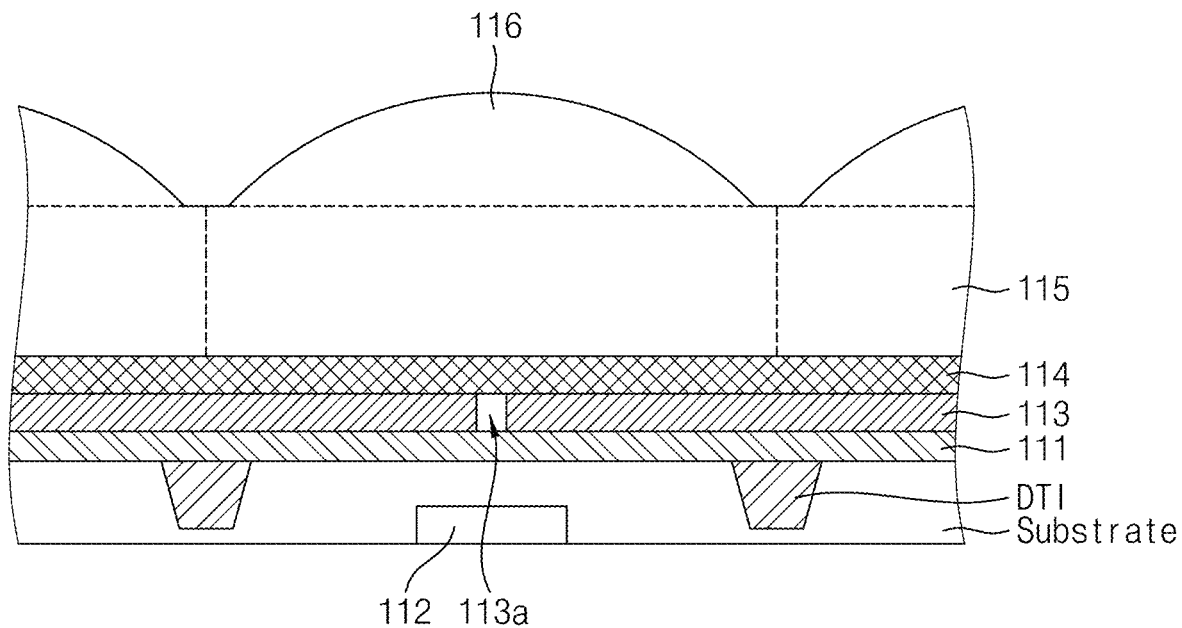
FIG. 3B is a diagram illustrating a dark current suppression layer disposed in the pixel shown in FIG. 3A.

FIG. 3B is a diagram illustrating a dark current suppression layer disposed in the pixel 110 shown in FIG. 3A.

As shown in FIG. 3B, the device isolation portion (e.g., device isolation region or device isolation film) DTI having a predetermined depth may be disposed between the pixels 110. A dark current suppression layer 111 may be disposed above the device isolation portion DTI and the photodiode 112. The light shield grid 113 may be disposed on the dark current suppression layer 111. The IR cut-off filter 114 may be disposed on the light shield grid 113.

For example, the device isolation portion DTI may be formed in the back side of the silicon substrate, and the dark current suppression layer 111 may be disposed above the device isolation portion DTI and the photodiode 112.

A voltage of 0 V to −2 V is applied to the light shield grid 113 and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, the dark current suppression layer 111 may be constituted by stacking two layers. The dark current suppression layer 111 in which an AlO layer and a TaO layer are stacked may be disposed above the photodiode 112. The dark current suppression layer 111 may be disposed on the front (or back) side of the silicon substrate to overlap the photodiode 112. The AlO layer may be disposed at a lower portion of the dark current suppression layer 111, and the TaO layer may be disposed on the AlO layer. The inventive concepts are not limited thereto. The TaO layer may be disposed in the lower portion of the dark current suppression layer 111, and the AlO layer may be disposed on the TaO layer. The AlO layer and the TaO layer may be disposed with the same thickness in the dark current suppression layer 111. The inventive concepts are not limited thereto, and the AlO layer and the TaO layer may be disposed with different thicknesses in the dark current suppression layer 111.

As another example, the dark current suppression layer 111 may be constituted by stacking two layers. The dark current suppression layer 111 in which the AlO layer and a HfO layer are stacked may be disposed above the photodiode 112. The dark current suppression layer 111 may be disposed on the front (or back) side of the silicon substrate to overlap the photodiode 112. The AlO layer may be disposed in the lower portion of the dark current suppression layer 111, and the HfO layer may be disposed on the AlO layer. The inventive concepts are not limited thereto. The HfO layer may be disposed in the lower portion of the dark current suppression layer 111, and the AlO layer may be disposed on the HfO layer. The AlO layer and the HfO layer may be disposed with the same thickness in the dark current suppression layer 111. The inventive concepts are not limited thereto. The AlO layer and the HfO layer may be disposed with different thicknesses in the dark current suppression layer 111.

As a further example, the dark current suppression layer 111 may be constituted by stacking two layers. The dark current suppression layer 111 in which the HfO layer and a ZrO layer are stacked may be disposed to overlap the photodiode 112. Alternatively, the dark current suppression layer 111 in which the ZrO layer and a LaO layer are stacked may be disposed above the photodiode 112. The ZrO layer may be disposed in the lower portion of the dark current suppression layer 111, and the LaO layer may be disposed on the ZrO layer. The inventive concepts are not limited thereto, and the LaO layer may be disposed in the lower portion of the dark current suppression layer 111, and a ZrO layer may be disposed on the LaO layer. The ZrO layer and the LaO layer may be disposed with the same thickness in the dark current suppression layer 111. The inventive concepts are not limited thereto, and the ZrO layer and the LaO layer may be disposed with different thicknesses in the dark current suppression layer 111.

In addition to the above-described combinations of layers, a first layer of the dark current suppression layer 111 may be formed of one material among AlO, TaO, HfO, ZrO, and LaO. A second layer of the dark current suppression layer 111 may be formed of another material different from the material of the first layer. The dark current suppression layer 111 may be formed by stacking the second layer on the first layer.

In some embodiments, the dark current suppression layer 111 may be constituted by stacking three layers. The dark current suppression layer 111 in which the AlO layer, the TaO layer, and the HfO layer are stacked may be disposed above the photodiode 112. The AlO layer may be disposed as a first layer of the dark current suppression layer 111. The TaO layer may be disposed as a second layer of the dark current suppression layer 111. The HfO layer may be disposed as a third layer of the dark current suppression layer 111. The first layer may be disposed at a lowermost position of the dark current suppression layer 111, the second layer may be disposed on the first layer, and the third layer may be disposed on the second layer. The inventive concepts are not limited thereto, and the positions of the AlO layer, the TaO layer, and the HfO layer in the dark current suppression layer 111 may be changed with one another. The AlO layer, the TaO layer, and the HfO layer may be disposed with the same thickness in the dark current suppression layer 111. The inventive concepts are not limited thereto, and the AlO layer, the TaO layer, and the HfO layer may be disposed with different thicknesses in the dark current suppression layer 111.

In some embodiments, the dark current suppression layer 111 may be constituted by stacking three layers. The dark current suppression layer 111 in which the TaO layer, the HfO layer, and the ZrO layer are stacked may be disposed above the photodiode 112. The TaO layer may be disposed as a first layer of the dark current suppression layer 111. The HfO layer may be disposed as a second layer of the dark current suppression layer 111. The ZrO layer may be disposed as a third layer of the dark current suppression layer 111. The first layer may be disposed at a lowermost position of the dark current suppression layer 111, the second layer may be disposed on the first layer, and the third layer may be disposed on the second layer. The inventive concepts are not limited thereto, and the positions of the TaO layer, the HfO layer, and the ZrO layer in the dark current suppression layer 111 may be changed with one another. The TaO layer, the HfO layer, and the ZrO layer may be disposed with the same thickness in the dark current suppression layer 111. The inventive concepts are not limited thereto, and the TaO layer, the HfO layer, and the ZrO layer may be disposed with different thicknesses in the dark current suppression layer 111.

In some embodiments, the dark current suppression layer 111 may be constituted by stacking three layers. The dark current suppression layer 111 in which the HfO layer, the ZrO layer, and the LaO layer are stacked may be disposed above the photodiode 112. The HfO layer may be disposed as a first layer of the dark current suppression layer 111. The ZrO layer may be disposed as a second layer of the dark current suppression layer 111. The LaO layer may be disposed as a third layer of the dark current suppression layer 111. The first layer may be disposed at a lowermost position of the dark current suppression layer 111, the second layer may be disposed on the first layer, and the third layer may be disposed on the second layer. The inventive concepts are not limited thereto, and the positions of the HfO layer, the ZrO layer, and the LaO layer in the dark current suppression layer 111 may be changed with one another. The HfO layer, the ZrO layer, and the LaO layer may be disposed with the same thickness in the dark current suppression layer 111. The inventive concepts are not limited thereto, and the HfO layer, the ZrO layer, and the LaO layer may be disposed with different thicknesses in the dark current suppression layer 111.

In addition to the above-described combinations of layers, the first layer of the dark current suppression layer 111 may be formed of one material among AlO, TaO, HfO, ZrO, and LaO. The second layer of the dark current suppression layer 111 may be formed of another material different from the material of the first layer. The third layer of the dark current suppression layer 111 may be formed of another material different from the materials of the first layer and the second layer.

In some embodiments, the dark current suppression layer 111 may be constituted by stacking four layers. The dark current suppression layer 111 in which the AlO layer, the TaO layer, the HfO layer, and the ZrO are stacked may be disposed above the photodiode 112. The AlO layer may be disposed as a first layer of the dark current suppression layer 111. The TaO layer may be disposed as a second layer of the dark current suppression layer 111. The HfO layer may be disposed as a third layer of the dark current suppression layer 111. The ZrO layer may be disposed as a fourth layer of the dark current suppression layer 111. The first layer may be disposed at a lowermost position of the dark current suppression layer 111, the second layer may be disposed on the first layer, the third layer may be disposed on the second layer, and the fourth layer may be disposed on the third layer. The inventive concepts are not limited thereto, and the positions of the AlO layer, the TaO layer, the HfO layer, and the ZrO layer in the dark current suppression layer 111 may be changed with one another. The AlO layer, the TaO layer, the HfO layer, and the ZrO layer may be disposed with the same thickness in the dark current suppression layer 111. The inventive concepts are not limited thereto, and the AlO layer, the TaO layer, the HfO layer, and the ZrO layer may be disposed with different thicknesses in the dark current suppression layer 111.

In some embodiments, the dark current suppression layer 111 may be constituted by stacking four layers. The dark current suppression layer 111 in which the TaO layer, the HfO layer, the ZrO layer, and the LaO layer are stacked may be disposed above the photodiode 112. The TaO layer may be disposed as a first layer of the dark current suppression layer 111. The HfO layer may be disposed as a second layer of the dark current suppression layer 111. The ZrO layer may be disposed as a third layer of the dark current suppression layer 111. The LaO layer may be disposed as a fourth layer of the dark current suppression layer 111. The first layer may be disposed at a lowermost position of the dark current suppression layer 111, the second layer may be disposed on the first layer, the third layer may be disposed on the second layer, and the fourth layer may be disposed on the third layer. The inventive concepts are not limited thereto, and the positions of the TaO layer, the HfO layer, the ZrO layer, and the LaO layer in the dark current suppression layer 111 may be changed with one another. The TaO layer, the HfO layer, the ZrO layer, and the LaO layer may be disposed with the same thickness in the dark current suppression layer 111. The inventive concepts are not limited thereto, and the TaO layer, the HfO layer, the ZrO layer, and the LaO layer may be disposed with different thicknesses in the dark current suppression layer 111.

In some embodiments, the dark current suppression layer 111 may be constituted by stacking four layers. The dark current suppression layer 111 in which the AlO layer, the TaO layer, the HfO layer, and the LaO are stacked may be disposed above the photodiode 112. The AlO layer may be disposed as a first layer of the dark current suppression layer 111. The TaO layer may be disposed as a second layer of the dark current suppression layer 111. The HfO layer may be disposed as a third layer of the dark current suppression layer 111. The LaO layer may be disposed as a fourth layer of the dark current suppression layer 111. The first layer may be disposed at a lowermost position of the dark current suppression layer 111, the second layer may be disposed on the first layer, the third layer may be disposed on the second layer, and the fourth layer may be disposed on the third layer. The inventive concepts are not limited thereto, and the positions of the AlO layer, the TaO layer, the HfO layer, and the LaO layer in the dark current suppression layer 111 may be changed with one another. The AlO layer, the TaO layer, the HfO layer, and the LaO layer may be disposed with the same thickness in the dark current suppression layer 111. The inventive concepts are not limited thereto, and the AlO layer, the TaO layer, the HfO layer, and the LaO layer may be disposed with different thicknesses in the dark current suppression layer 111.

In addition to the above-described combinations of layers, the first layer of the dark current suppression layer 111 may be formed of one material among AlO, TaO, HfO, ZrO, and LaO. The second layer of the dark current suppression layer 111 may be formed of another material different from the material of the first layer. The third layer of the dark current suppression layer 111 may be formed of another material different from the materials of the first layer and the second layer. The fourth layer of the dark current suppression layer 111 may be formed of another material different from the materials of the first layer, the second layer, and the third layer. The first to fourth layers may be sequentially stacked to form the dark current suppression layer 111.

Figure 3C:
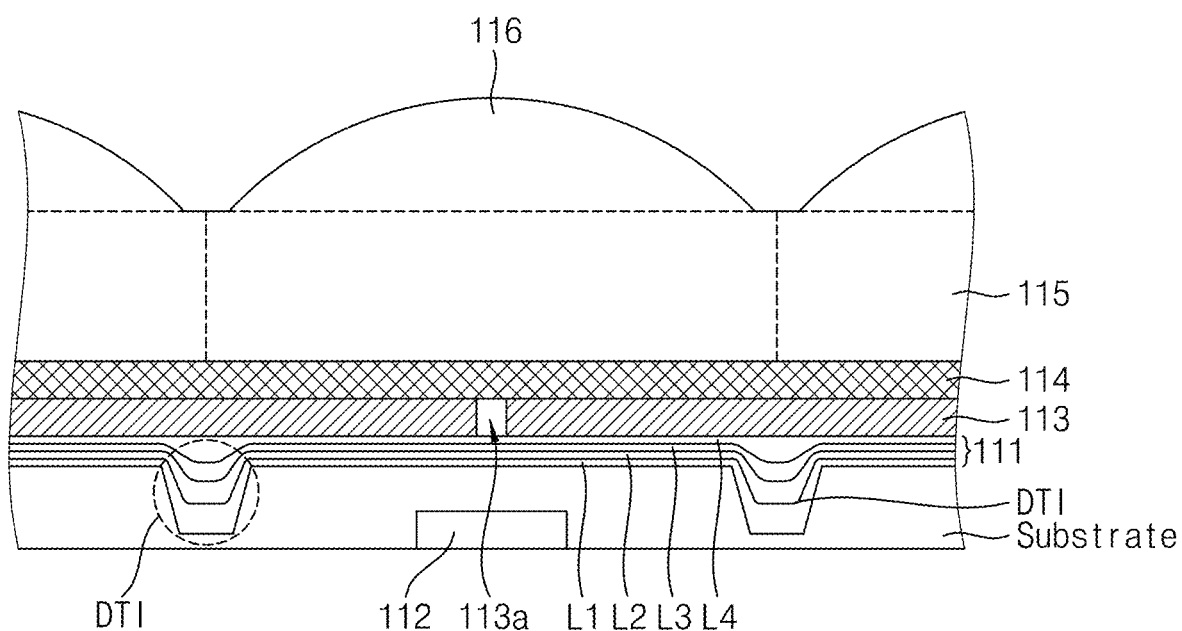
FIG. 3C is a diagram illustrating the device isolation portion and the dark current suppression layer in detail.

FIG. 3C is a diagram illustrating the device isolation portion and the dark current suppression layer in detail.

Referring to FIG. 3C, the dark current suppression layer 111 may be integrally formed with the device isolation portion (e.g., device isolation region or device isolation film) DTI. The dark current suppression layer 111 may be formed on the front (or back) side of the silicon substrate. For example, after a trench is formed, the dark current suppression layer 111 and the device isolation portion DTI, each of which include a plurality of layers, may be formed in the front (or back) side of the silicon substrate and the trench. Each of the dark current suppression layer 111 and the device isolation portion DTI may be formed in/as a structure in which a plurality of layers are stacked. When each of the dark current suppression layer 111 and the device isolation portion DTI is formed with four layers, a first layer L1 thereof may be formed of one material among AlO, TaO, HfO, ZrO, and LaO. A second layer L2 may be formed of a material different from the material of the first layer L1. A third layer L3 may be formed of a material different from the materials of the first layer L1 and the second layer L2. A fourth layer L4 may be formed of a material different from the materials of the first to third layers L1, L2, and L3. The inventive concepts are not limited thereto, and each of the dark current suppression layer 111 and the device isolation portion DTI may also be formed with two to three layers or five or more layers. When the dark current suppression layer 111 and the device isolation portion DTI are integrally formed, each of the dark current suppression layer 111 and the device isolation portion DTI may be formed by stacking a plurality of layers, each of which have a fixed negative charge.

Figure 6A:
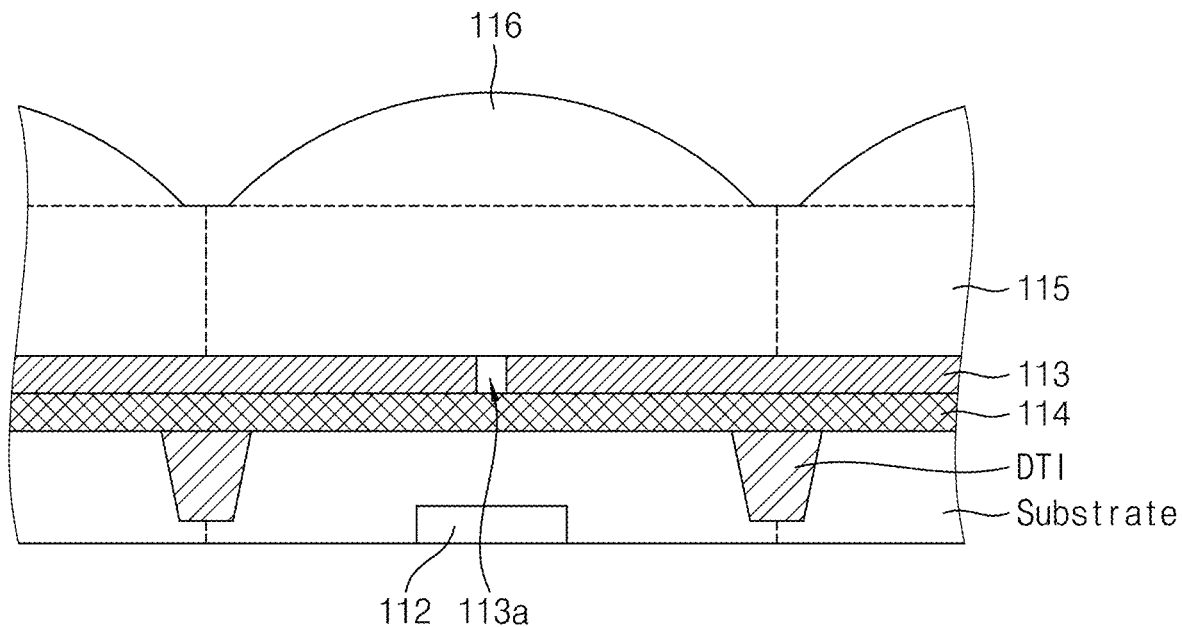
FIG. 6A is a diagram illustrating an IR cut-off filter disposed below the light shield grid according to some example embodiments of the inventive concepts.
Figure 6B:
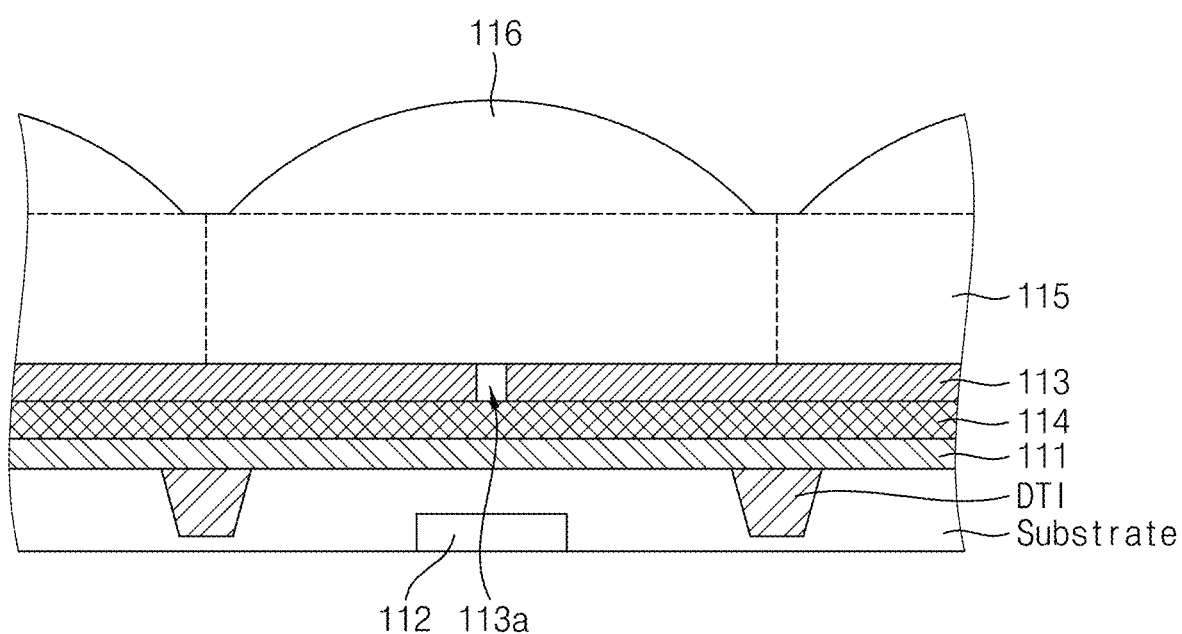
FIG. 6B is a diagram illustrating the dark current suppression layer disposed in the pixel shown in FIG. 6A.

FIG. 6A is a diagram illustrating an IR cut-off filter disposed below the light shield grid according to some example embodiments of the inventive concepts. FIG. 6B is a diagram illustrating the dark current suppression layer disposed in the pixel 110 shown in FIG. 6A. In describing the pixel 110 shown in FIGS. 6A and 6B, a description of a structure that is the same as that of the pixel 110 shown in FIGS. 3A to 3C will be omitted.

Referring to FIGS. 1 and 6A, each of the plurality of pixels 110 may include the photodiode 112, the light shield grid 113, the device isolation portion (e.g., device isolation region or device isolation film) DTI, the IR cut-off filter 114, the planarization layer 115, and the lens 116.

During a manufacturing process of the image sensor 100, the back side of the silicon substrate is polished to have a thickness (e.g., 3 μm) through which light may transmit such that the photodiode 112 may be formed on the back side of the silicon substrate. The transistors TX, RX, DX, and SX and the lines are formed on the front side of the silicon substrate. Then, the IR cut-off filter 114, the light shield grid 113, the planarization layer 115, and the lens 116 may be disposed above the photodiode 112.

In the BSI image sensor 100, the lines are disposed below the photodiode 112 (on the front side of the silicon substrate) such that the incident light is not hindered by the lines. Thus, the image sensor 100 may collect a wide angle of light on the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The IR cut-off filter 114 is configured to prevent/reduce a photoelectric effect due to IRs out of a visible ray range and may be disposed between the photodiode 112 and the light shield grid 113. The light shield grid 113 including an opening 113a may be disposed on the IR cut-off filter 114 so as to allow light to be incident on the photodiode 112. A transparent layer formed of a transparent material may be disposed in the opening 113a.

Light generated from the OLED panel 210 may be reflected by a finger and be incident on each of the pixels 110 of the image sensor 100. The light passes through the lens 116 and the planarization layer 115. Then, the light is incident on the IR cut-off filter 114 via the opening 113a formed by the light shield grid 113. The light passing through the IR cut-off filter 114 may be incident on the photodiode 112. Light having a wavelength range corresponding to an IR range may be cut-off by the IR cut-off filter 114.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

Referring to FIG. 6B, the device isolation portion DTI having a predetermined depth may be disposed between the pixels 110. The dark current suppression layer 111 may be disposed above the device isolation portion DTI and the photodiode 112. The IR cut-off filter 114 may be disposed on the dark current suppression layer 111. The light shield grid 113 may be disposed on the IR cut-off filter 114.

For example, the device isolation portion DTI may be formed in the back side of the silicon substrate, and the dark current suppression layer 111 may be disposed above the device isolation portion DTI and the photodiode 112.

The dark current suppression layer 111 may be formed on the front (or back) side of the silicon substrate. A voltage of 0 V to −2 V is applied to the light shield grid 113, and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 6B, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge.

Figure 7A:
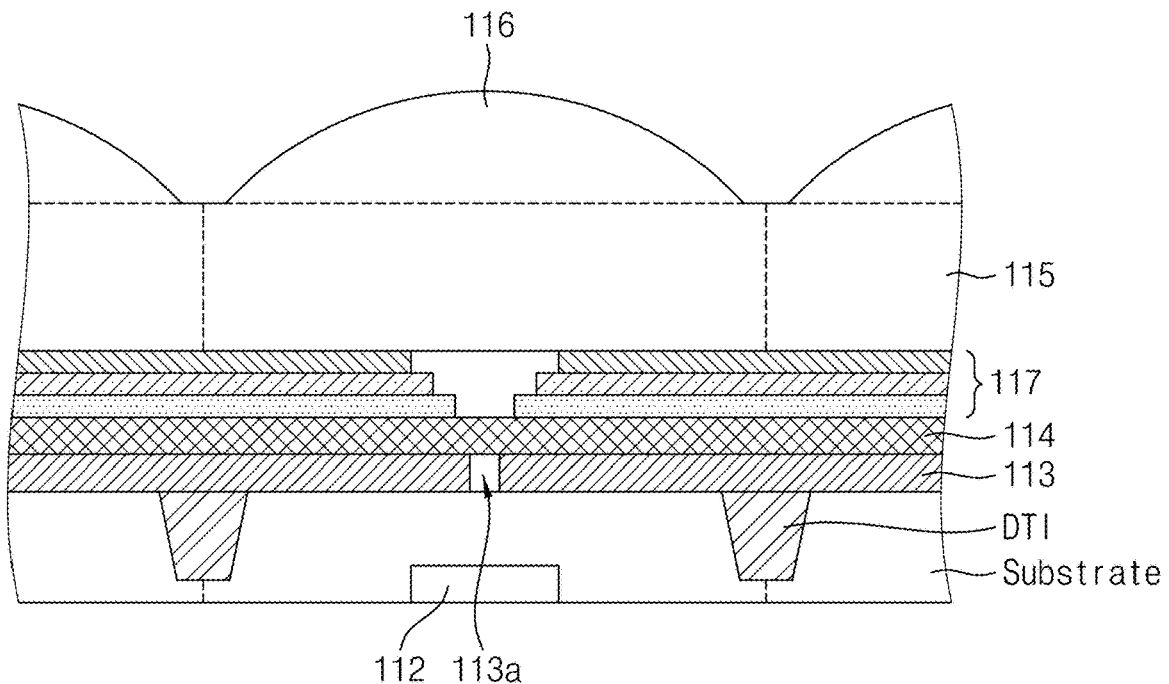
FIG. 7A is a diagram illustrating the IR cut-off filter disposed on the light shield grid and a light cut-off filter layer disposed on the IR cut-off filter according to some example embodiments of the inventive concepts.
Figure 7B:
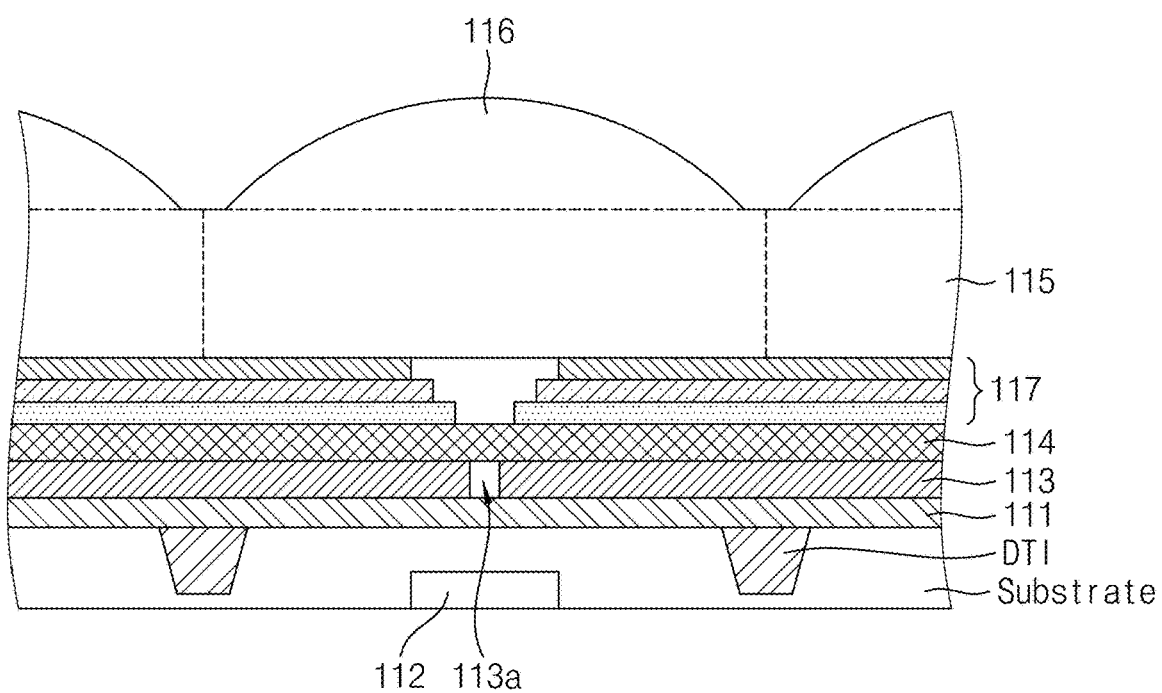
FIG. 7B is a diagram illustrating the dark current suppression layer disposed in the pixel shown in FIG. 7A.

FIG. 7A is a diagram illustrating the IR cut-off filter disposed on the light shield grid and a light cut-off filter layer disposed on the IR cut-off filter according to some example embodiments of the inventive concepts. FIG. 7B is a diagram illustrating the dark current suppression layer disposed in the pixel 110 shown in FIG. 7A. In describing the pixel 110 shown in FIGS. 7A and 7B, a description of a structure that is the same as that of the pixel 110 shown in FIGS. 3A to 3C will be omitted.

Referring to FIGS. 1 and 7A, each of the plurality of pixels 110 may include the photodiode 112, the light shield grid 113, the device isolation portion (e.g., device isolation region or device isolation film) DTI, the IR cut-off filter 114, a light cut-off filter layer 117, the planarization layer 115, and the lens 116.

During a manufacturing process of the image sensor 100, the back side of the silicon substrate is polished to have a thickness (e.g., 3 μm) through which light may transmit such that the photodiode 112 may be formed on the back side of the silicon substrate. The transistors TX, RX, DX, and SX and the lines are formed on the front side of the silicon substrate. Then, the light shield grid 113, the IR cut-off filter 114, the light cut-off filter layer 117, the planarization layer 115, and the lens 116 may be disposed above the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The light shield grid 113 may be disposed above the photodiode 112. The IR cut-off filter 114 may be disposed on the light shield grid 113. The light cut-off filter layer 117 may be disposed on the IR cut-off filter 114. The planarization layer 115 may be disposed on the light cut-off filter layer 117. The lens 116 may be disposed on the planarization layer 115.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The IR cut-off filter 114 is configured to prevent/reduce a photoelectric effect due to IRs out of a visible ray range and may be disposed above the photodiode 112 and the light shield grid 113.

The light shield grid 113 may be formed of a metal material such as W. Light incident on the pixel 110 may be reflected from an upper surface of the light shield grid 113. In this case, the light reflected from the supper surface of the light shield grid 113 is visible at the outside of the pixel 110. Owing to the light reflected from the upper surface of the light shield grid 113, quality of an image displayed on the OLED panel 210 may be degraded. According to the inventive concepts, in order to prevent/impede reflection of light from the upper surface of the light shield grid 113, the light cut-off filter layer 117 may be disposed above the light shield grid 113.

For example, in order to prevent/impede reflection of light from the upper surface of the light shield grid 113, the light cut-off filter layer 117 may be disposed in a form in which a red color filter, a green color filter, and a blue color filter are stacked.

For example, the light cut-off filter layer 117 may be formed in a structure in which two or more color filters selected from the group consisting of a red color filter, a green color filter, a blue color filter, a cyan color filter, a magenta color filter, and a yellow color filter are stacked.

The color filters constituting the light cut-off filter layer 117 may be formed of an organic material. The organic material used for the color filter may be one material or a combination of two or more materials selected from the group consisting of polyacetylene, poly(p-phenylene), polythiophene, poly(3,4-ethylenedioxy thiophene) (PEDOT), polypyrrole, poly(p-phenylene sulfide), poly(p-phenylene vinylene), and polyaniline.

Light generated from the OLED panel 210 may be reflected by a finger and be incident on each of the pixels 110 of the image sensor 100. The light passes through the lens 116 and the planarization layer 115. The light may pass through the IR cut-off filter 114 and be incident on the photodiode 112 via the opening 113a formed by the light shield grid 113. Light having a wavelength range corresponding to an IR range may be cut-off by the IR cut-off filter 114.

Referring to FIG. 7B, the device isolation portion DTI having a predetermined depth may be disposed between the pixels 110. The dark current suppression layer 111 may be disposed above the device isolation portion DTI and the photodiode 112. The light shield grid 113 may be disposed on the dark current suppression layer 111. The IR cut-off filter 114 may be disposed on the light shield grid 113. The light cut-off filter layer 117 may be disposed on the IR cut-off filter 114. The planarization layer 115 may be disposed on the light cut-off filter layer 117. The lens 116 may be disposed on the planarization layer 115.

For example, the device isolation portion DTI may be formed in the back side of the silicon substrate, and the dark current suppression layer 111 may be disposed above the device isolation portion DTI and the photodiode 112. The dark current suppression layer 111 may be integrally formed with the device isolation portion DTI. The dark current suppression layer 111 may be formed on the front (or back) side of the silicon substrate. A voltage of 0 V to −2 V is applied to the light shield grid 113, and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 3C, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge. As shown in FIGS. 4A and 4B, the IR cut-off filter 114 may be constituted of a plurality of layers formed by the plurality of low refractive index films 114L having the same refractive index and the plurality of high refractive index films 114H having the same refractive index being alternately stacked.

As shown in FIGS. 4C and 4D, the IR cut-off filter 114 may be constituted of a plurality of layers formed by the plurality of high refractive index films 114H-1 to 114H-10 having different refractive indexes and the plurality of low refractive index films 114L-1 to 114L-10 having different refractive indexes being alternately stacked.

In order to prevent/impede reflection of light from the upper surface of the light shield grid 113, the light cut-off filter layer 117 may be disposed in a form in which a red color filter, a green color filter, and a blue color filter are stacked.

The light cut-off filter layer 117 may be formed in a structure in which two or more color filters selected from the group consisting of a red color filter, a green color filter, a blue color filter, a cyan color filter, a magenta color filter, and a yellow color filter are stacked.

Figure 8A:
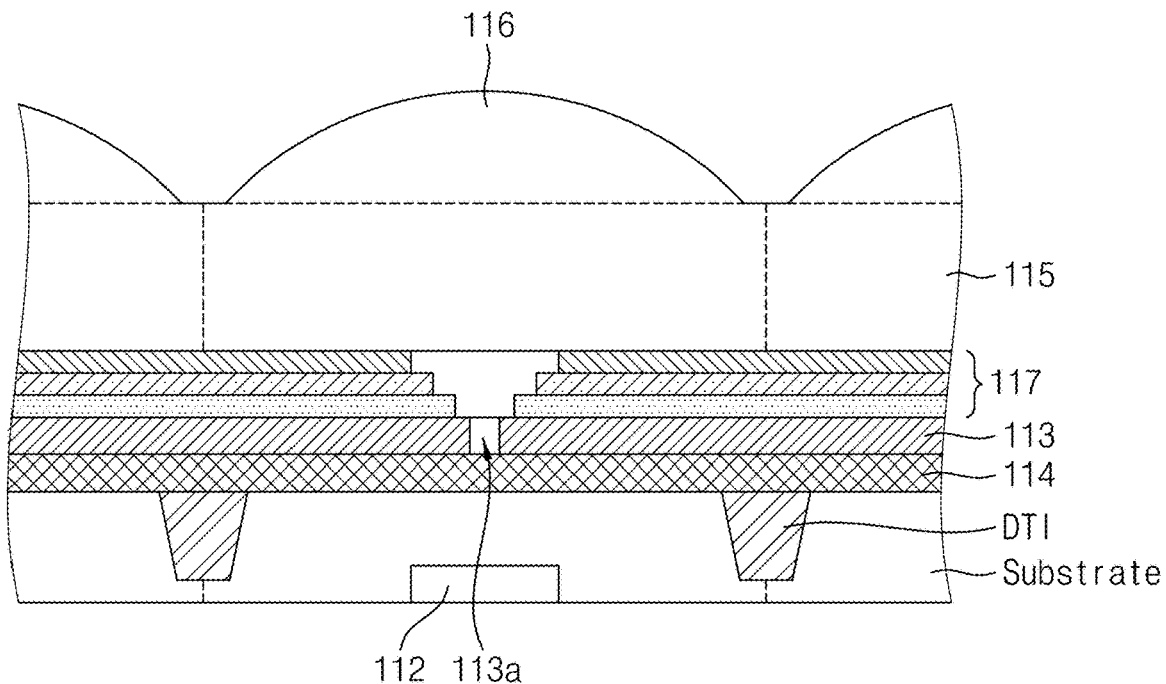
FIG. 8A is a diagram illustrating the light cut-off filter layer disposed on the light shield grid and the IR cut-off filter is disposed below the light shield grid according to some example embodiments of the inventive concepts.
Figure 8B:
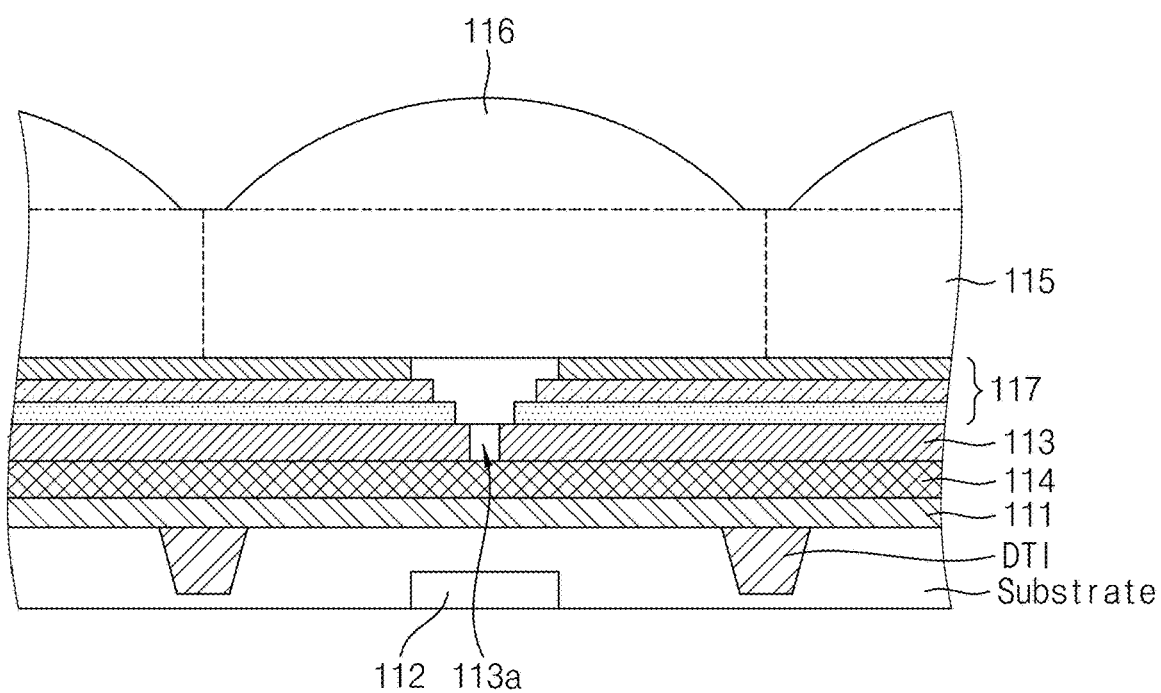
FIG. 8B is a diagram illustrating the dark current suppression layer disposed in the pixel shown in FIG. 8A.

FIG. 8A is a diagram illustrating the light cut-off filter layer disposed on the light shield grid and the IR cut-off filter is disposed below the light shield grid according to some example embodiments of the inventive concepts. FIG. 8B is a diagram illustrating and the dark current suppression layer disposed in the pixel 110 shown in FIG. 8A. In describing the pixel 110 shown in FIGS. 8A and 8B, a description of a structure that is the same as that of the pixel 110 shown in FIGS. 3A to 3C will be omitted.

Referring to FIGS. 1 and 8A, each of the plurality of pixels 110 may include the photodiode 112, the light shield grid 113, the device isolation portion (e.g., device isolation region or device isolation film) DTI, the IR cut-off filter 114, the light cut-off filter layer 117, the planarization layer 115, and the lens 116.

The photodiode 112 may be formed on the back side of the silicon substrate. The transistors TX, RX, DX, and SX and the lines are formed on the front side of the silicon substrate. Then, the IR cut-off filter 114, the light shield grid 113, the light cut-off filter layer 117, the planarization layer 115, and the lens 116 may be disposed above the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film.

The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The IR cut-off filter 114 may be disposed above the photodiode 112. The light shield grid 113 may be disposed on the IR cut-off filter 114. The light cut-off filter layer 117 may be disposed on the light shield grid 113. The planarization layer 115 may be disposed on the light cut-off filter layer 117. The lens 116 may be disposed on the planarization layer 115.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The IR cut-off filter 114 is configured to prevent/reduce a photoelectric effect due to IRs out of a visible ray range and may be disposed above the photodiode 112 and the light shield grid 113.

The light shield grid 113 may be formed of a metal material such as W. Light incident on the pixel 110 may be reflected from an upper surface of the light shield grid 113. In this case, the light reflected from the supper surface of the light shield grid 113 is visible at the outside of the pixel 110. Owing to the light reflected from the upper surface of the light shield grid 113, quality of an image displayed on the OLED panel 210 may be degraded. According to the inventive concepts, in order to prevent/impede reflection of light from the upper surface of the light shield grid 113, the light cut-off filter layer 117 may be disposed on above the light shield grid 113.

For example, in order to prevent/impede reflection of light from the upper surface of the light shield grid 113, the light cut-off filter layer 117 may be disposed in a form in which a red color filter, a green color filter, and a blue color filter are stacked.

For example, the light cut-off filter layer 117 may be formed in a structure in which two or more color filters selected from the group consisting of a red color filter, a green color filter, a blue color filter, a cyan color filter, a magenta color filter, and a yellow color filter are stacked.

The color filters constituting the light cut-off filter layer 117 may be formed of an organic material. The organic material used for the color filter may be one material or a combination of two or more materials selected from the group consisting of polyacetylene, poly(p-phenylene), polythiophene, poly(3,4-ethylenedioxy thiophene) (PEDOT), polypyrrole, poly(p-phenylene sulfide), poly(p-phenylene vinylene), and polyaniline.

Light generated from the OLED panel 210 may be reflected by a finger and be incident on each of the pixels 110 of the image sensor 100. The light passes through the lens 116 and the planarization layer 115. The light may pass through the IR cut-off filter 114 and be incident on the photodiode 112 via the opening 113a formed in the light shield grid 113. Light having a wavelength range corresponding to an IR range may be cut-off by the IR cut-off filter 114.

Referring to FIG. 8B, the device isolation portion DTI having a predetermined depth may be disposed between the pixels 110. The dark current suppression layer 111 may be disposed above the device isolation portion DTI and the photodiode 112. The IR cut-off filter 114 may be disposed on the dark current suppression layer 111. The light shield grid 113 may be disposed on the IR cut-off filter 114. The light cut-off filter layer 117 may be disposed on the light shield grid 113. The planarization layer 115 may be disposed on the light cut-off filter layer 117. The lens 116 may be disposed on the planarization layer 115.

For example, the device isolation portion DTI may be formed in the back side of the silicon substrate, and the dark current suppression layer 111 may be disposed above the device isolation portion DTI and the photodiode 112.

The dark current suppression layer 111 may be formed on the front (or back) side of the silicon substrate. A voltage of 0 V to −2 V is applied to the light shield grid 113, and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 3C, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge. As shown in FIGS. 4A and 4B, the IR cut-off filter 114 may be constituted of a plurality of layers formed by the plurality of low refractive index films 114L having the same refractive index and the plurality of high refractive index films 114H having the same refractive index being alternately stacked.

As shown in FIGS. 4C and 4D, the IR cut-off filter 114 may be constituted of a plurality of layers formed by the plurality of high refractive index films 114H-1 to 114H-10 having different refractive indexes and the plurality of low refractive index films 114L-1 to 114L-10 having different refractive indexes being alternately stacked.

In order to prevent/impede reflection of light from the upper surface of the light shield grid 113, the light cut-off filter layer 117 may be disposed in a form in which a red color filter, a green color filter, and a blue color filter are stacked.

The light cut-off filter layer 117 may be formed in a structure in which two or more color filters selected from the group consisting of a red color filter, a green color filter, a blue color filter, a cyan color filter, a magenta color filter, and a yellow color filter are stacked.

Figure 9A:
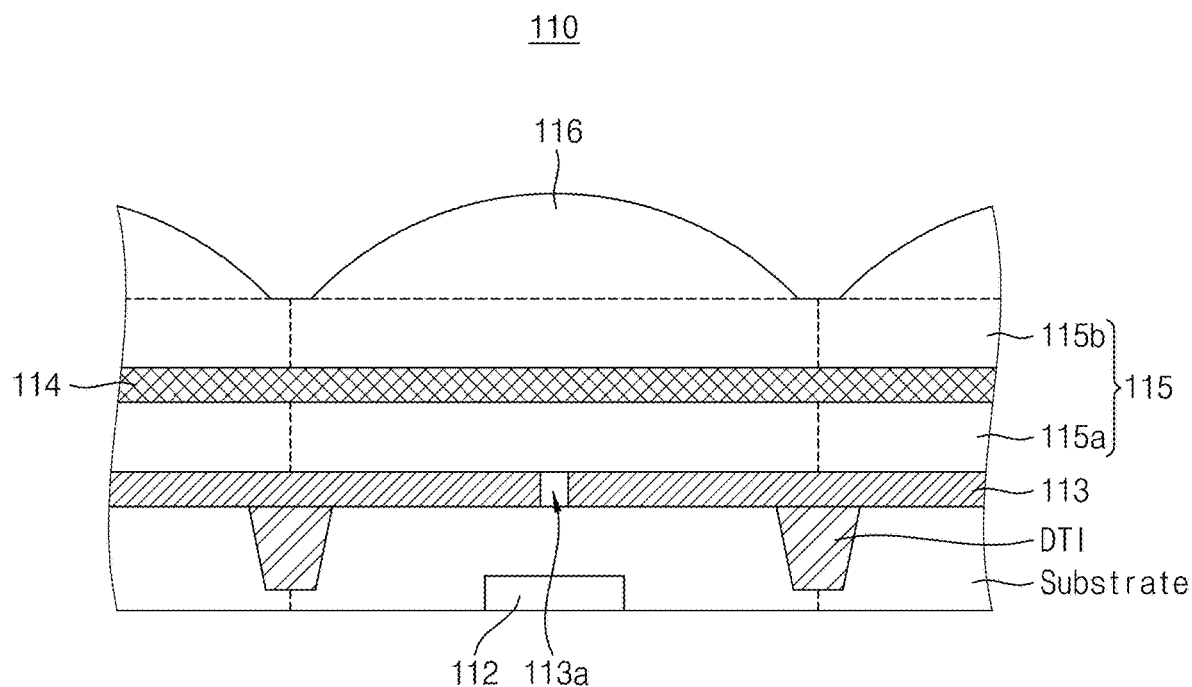
FIG. 9A is a diagram illustrating the IR cut-off filter disposed at a central portion of the planarization layer according to some example embodiments of the inventive concepts.
Figure 9B:
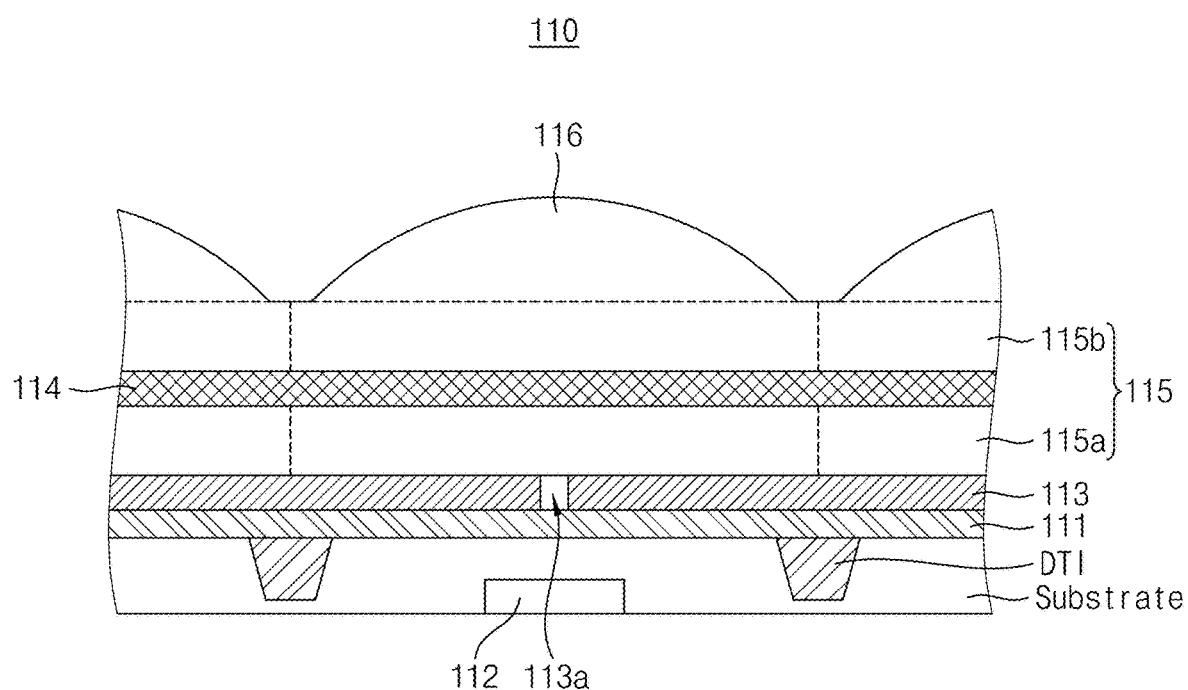
FIG. 9B is a diagram illustrating the dark current suppression layer disposed in the pixel shown in FIG. 9A.

FIG. 9A is a diagram illustrating the IR cut-off filter disposed at a central portion of the planarization layer according to some example embodiments of the inventive concepts. FIG. 9B is a diagram illustrating the dark current suppression layer disposed in the pixel 110 shown in FIG. 9A. In describing the pixel 110 shown in FIGS. 9A and 9B, a description of a structure that is the same as that of the pixel 110 shown in FIGS. 3A to 3C will be omitted.

Referring to FIGS. 1 and 9A, each of the plurality of pixels 110 may include the photodiode 112, the light shield grid 113, the device isolation portion (e.g., device isolation region or device isolation film) DTI, the IR cut-off filter 114, the planarization layer 115, and the lens 116.

The photodiode 112 may be formed on the back side of the silicon substrate. The transistors TX, RX, DX, and SX and the lines are formed on the front side of the silicon substrate. Then, the light shield grid 113, the IR cut-off filter 114, the planarization layer 115, and the lens 116 may be disposed above the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The light shield grid 113 may be disposed above the photodiode 112. The planarization layer 115 and the IR cut-off filter 114 may be disposed above the light shield grid 113. The lens 116 may be disposed on the planarization layer 115.

The planarization layer 115 may be constituted of a first planarization layer 115a and a second planarization layer 115b. The IR cut-off filter 114 may be disposed between the first planarization layer 115a and the second planarization layer 115b. The IR cut-off filter 114 may be disposed in the middle of the planarization layer 115. The first planarization layer 115a may be formed of a transparent material with a predetermined thickness during a manufacturing process. The IR cut-off filter 114 may be formed on the first planarization layer 115a. The second planarization layer 115b may be formed on the IR cut-off filter 114 with a predetermined thickness. The lens 116 may be disposed on the planarization layer 115.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The IR cut-off filter 114 is configured to prevent/reduce a photoelectric effect due to IRs out of a visible ray range and may be disposed above the photodiode 112 and the light shield grid 113.

Light generated from the OLED panel 210 may be reflected by a finger and be incident on each of the pixels 110 of the image sensor 100. The light may pass through the lens 116, the planarization layer 115, and the IR cut-off filter 114. The light may be incident on the photodiode 112 via the opening 113a formed by the light shield grid 113. Light having a wavelength range corresponding to an IR range may be cut-off by the IR cut-off filter 114.

Referring to FIG. 9B, the device isolation portion DTI having a predetermined depth may be disposed between the pixels 110. The dark current suppression layer 111 may be disposed above the device isolation portion DTI and the photodiode 112. The light shield grid 113 may be disposed on the dark current suppression layer 111. The planarization layer 115 and the IR cut-off filter 114 may be disposed above the light shield grid 113. The lens 116 may be disposed on the planarization layer 115.

For example, the device isolation portion DTI may be formed in the back side of the silicon substrate, and the dark current suppression layer 111 may be disposed above the device isolation portion DTI and the photodiode 112.

The dark current suppression layer 111 may be formed on the front (or back) side of the silicon substrate. A voltage of 0 V to −2 V is applied to the light shield grid 113 and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 3C, the dark current suppression layer 111 and the device isolation portion DTI may be collectively integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge.

As shown in FIGS. 4A and 4B, the IR cut-off filter 114 may be constituted of a plurality of layers formed by the plurality of low refractive index films 114L having the same refractive index and the plurality of high refractive index films 114H having the same refractive index being alternately stacked.

As shown in FIGS. 4C and 4D, the IR cut-off filter 114 may be constituted of a plurality of layers formed by the plurality of high refractive index films 114H-1 to 114H-10 having different refractive indexes and the plurality of low refractive index films 114L-1 to 114L-10 having different refractive indexes being alternately stacked.

Figure 10A:
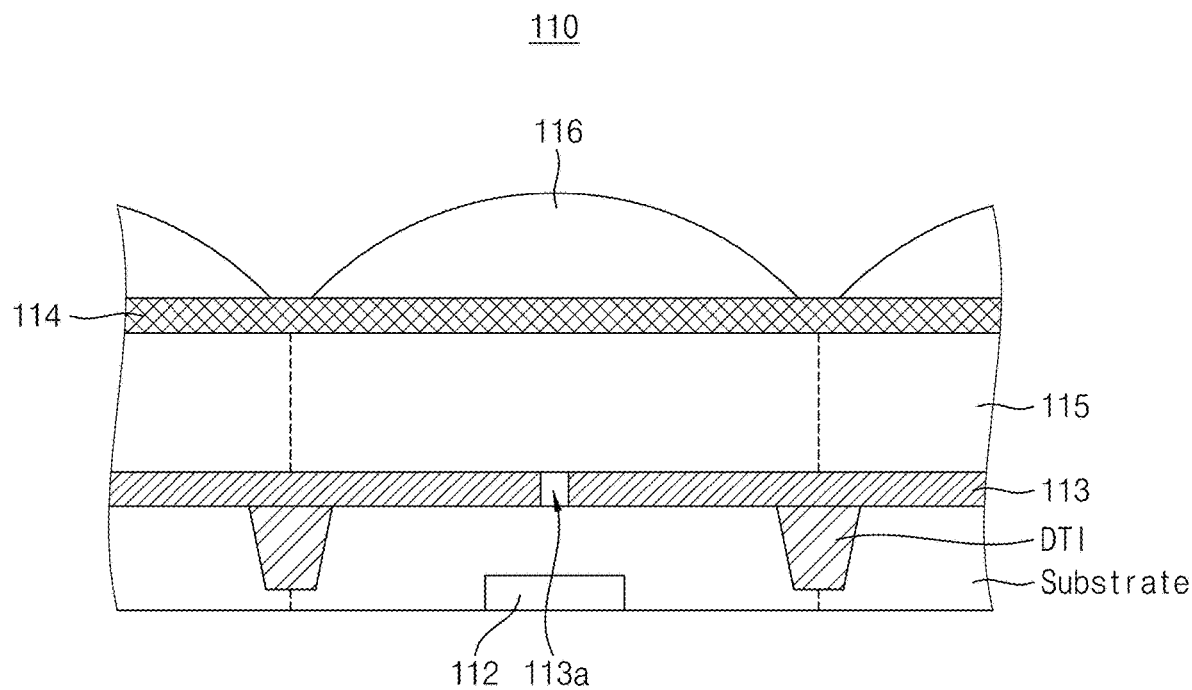
FIG. 10A is a diagram illustrating the IR cut-off filter disposed on the planarization layer according to some example embodiments of the inventive concepts.
Figure 10B:
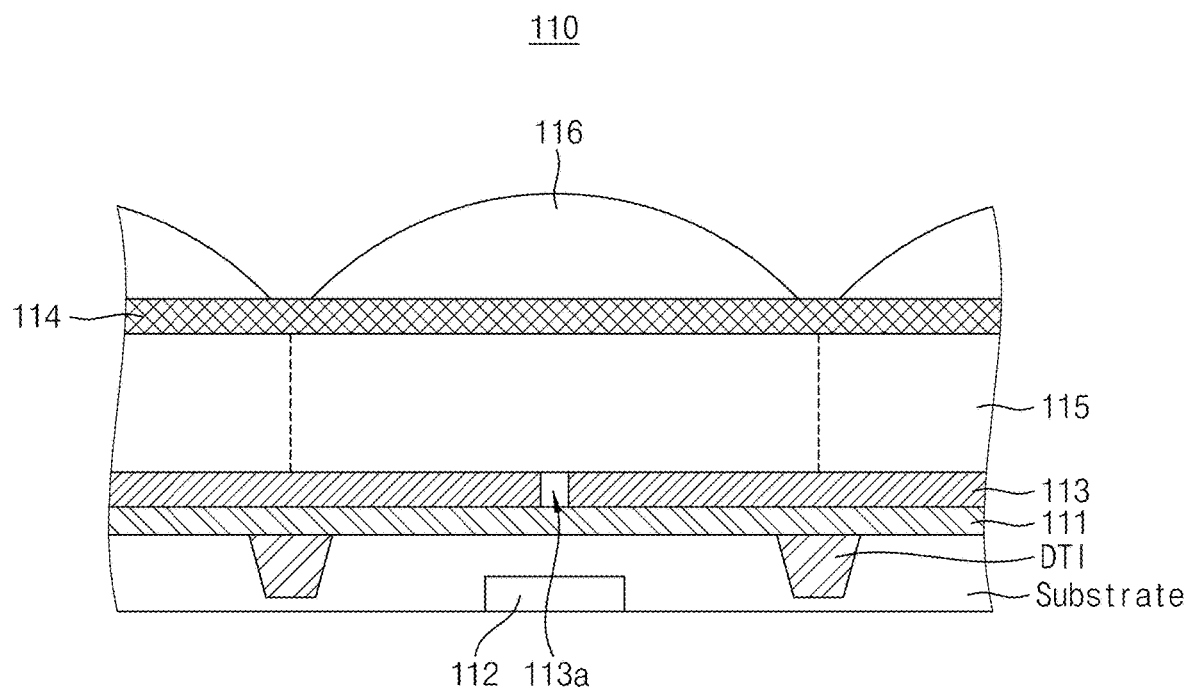
FIG. 10B is a diagram illustrating the dark current suppression layer disposed in the pixel shown in FIG. 10A.

FIG. 10A is a diagram illustrating the IR cut-off filter disposed on the planarization layer according to some example embodiments of the inventive concepts. FIG. 10B is a diagram illustrating the dark current suppression layer disposed in the pixel 110 shown in FIG. 10A. In describing the pixel 110 shown in FIGS. 10A and 10B, a description of a structure that is the same as that of the pixel 110 shown in FIGS. 3A to 3C will be omitted.

Referring to FIGS. 1 and 10A, each of the plurality of pixels 110 may include the photodiode 112, the light shield grid 113, the device isolation portion (e.g., device isolation region or device isolation film) DTI, planarization layer 115, the IR cut-off filter 114, and the lens 116.

The photodiode 112 may be formed on the back side of the silicon substrate. The transistors TX, RX, DX, and SX and the lines are formed on the front side of the silicon substrate. Then, the light shield grid 113, the IR cut-off filter 114, the planarization layer 115, and the lens 116 may be disposed above the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The light shield grid 113 may be disposed above the photodiode 112. The planarization layer 115 may be disposed on the light shield grid 113. The IR cut-off filter 114 may be disposed on the planarization layer 115. The lens 116 may be disposed on the IR cut-off filter 114.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The IR cut-off filter 114 is configured to prevent/reduce a photoelectric effect due to IRs out of a visible ray range and may be disposed on the planarization layer 115.

Light generated from the OLED panel 210 may be reflected by a finger and be incident on each of the pixels 110 of the image sensor 100. The light may pass through the lens 116, the IR cut-off filter 114, and the planarization layer 115. The light may be incident on the photodiode 112 via the opening 113a formed in the light shield grid 113. Light having a wavelength range corresponding to an IR range may be cut-off by the IR cut-off filter 114.

Referring to FIG. 10B, the device isolation portion DTI having a predetermined depth may be disposed between the pixels 110. The dark current suppression layer 111 may be disposed above the device isolation portion DTI and the photodiode 112. The light shield grid 113 may be disposed on the dark current suppression layer 111. The planarization layer 115 may be disposed on the light shield grid 113. The IR cut-off filter 114 may be disposed on the planarization layer 115. The lens 116 may be disposed on the IR cut-off filter 114.

For example, the device isolation portion DTI may be formed in the back side of the silicon substrate, and the dark current suppression layer 111 may be disposed above the device isolation portion DTI and the photodiode 112. A voltage of 0 V to −2 V is applied to the light shield grid 113, and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 3C, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge.

As shown in FIGS. 4A and 4B, the IR cut-off filter 114 may be constituted of a plurality of layers formed by the plurality of low refractive index films 114L having the same refractive index and the plurality of high refractive index films 114H having the same refractive index being alternately stacked.

As shown in FIGS. 4C and 4D, the IR cut-off filter 114 may be constituted of a plurality of layers formed by the plurality of high refractive index films 114H-1 to 114H-10 having different refractive indexes and the plurality of low refractive index films 114L-1 to 114L-10 having different refractive indexes being alternately stacked.

Figure 11A:
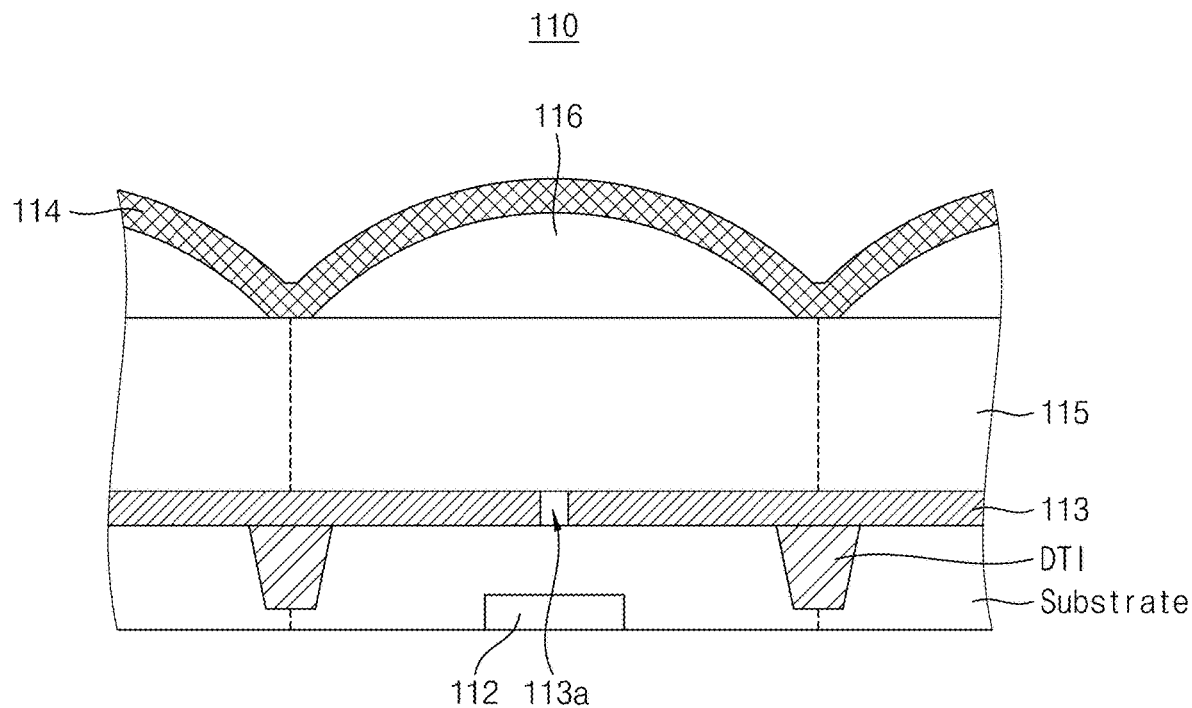
FIG. 11A is a diagram illustrating the IR cut-off filter disposed on the lens according to some example embodiments of the inventive concepts.
Figure 11B:
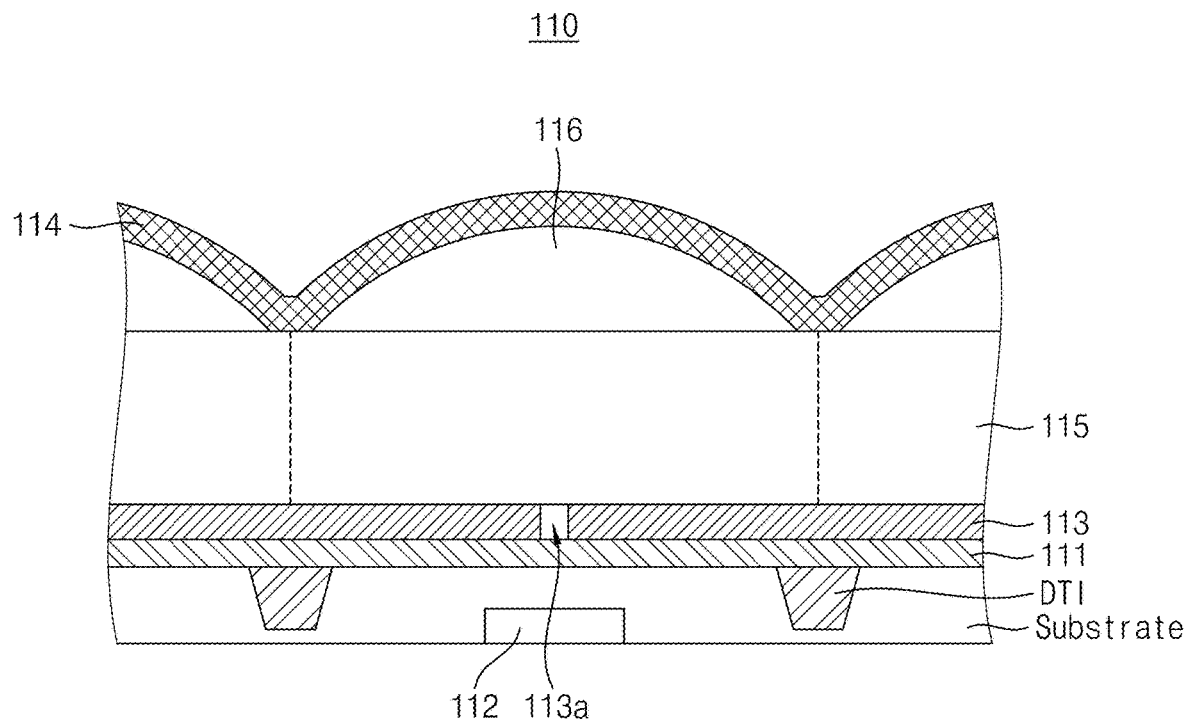
FIG. 11B is a diagram illustrating the dark current suppression layer disposed in the pixel shown in FIG. 11A.

FIG. 11A is a diagram illustrating the IR cut-off filter disposed on the lens according to some example embodiments of the inventive concepts. FIG. 11B is a diagram illustrating the dark current suppression layer disposed in the pixel 110 shown in FIG. 11A. In describing the pixel 110 shown in FIGS. 11A and 11B, a description of a structure that is the same as that of the pixel 110 shown in FIGS. 3A to 3C will be omitted.

Referring to FIGS. 1 and 11A, each of the plurality of pixels 110 may include the photodiode 112, the light shield grid 113, the device isolation portion (e.g., device isolation region or device isolation film) DTI, the planarization layer 115, the lens 116, and the IR cut-off filter 114.

The photodiode 112 may be formed on the back side of the silicon substrate. The transistors TX, RX, DX, and SX and the lines are formed on the front side of the silicon substrate. Then, the light shield grid 113, the planarization layer 115, the lens 116, and the IR cut-off filter 114 may be disposed above the photodiode 112.

The device isolation portion DTI having a predetermined depth may be disposed between the pixels 110. The device isolation portion DTI is configured to reduce interference between the pixels 110 and may be disposed to surround each of the pixels 110. The device isolation portion DTI may be formed by forming a trench on the back side of the silicon substrate and then filling the trench with an insulating film. The device isolation portion DTI may be formed to have a depth of 1 μm to 5 μm. The device isolation portion DTI may be formed as a deep trench isolation layer including an insulating material. The device isolation portion DTI may be formed of an insulating material having a refractive index that is less than that of the silicon substrate, thereby preventing/impeding light incident on each of the pixels 110 from passing over adjacent pixels 110. The device isolation portion DTI is deeply formed in the silicon substrate such that light interference between adjacent pixels 110 may be prevented/impeded.

The light shield grid 113 may be disposed above the photodiode 112. The planarization layer 115 may be disposed on the light shield grid 113. The lens 116 may be disposed on the planarization layer 115. The IR cut-off filter 114 may be disposed on the lens 116. The IR cut-off filter 114 may be disposed between the lens 116 and the OLED panel 210.

The light shield grid 113 may be formed of a metal material such as W. The image sensor 100 of the inventive concepts is configured to generate a fingerprint image of a finger, and the opening 113a of the light shield grid 113 may be formed to be very small (see FIGS. 5A and 5B).

For example, the opening 113a of the light shield grid 113 may be formed to correspond to an area of 1 to 15% of each of the pixels 110. An area of 1 to 15% of the pixel 110 is opened by the opening 113a. Light may be incident on the photodiode 112 through the opening 113a, which is formed to be smaller than the area of the pixel 110. Since the opening 113a of the light shield grid 113 is formed to be very small, light may be accurately incident on the photodiode 112 without passing over adjacent pixels 110.

In order to suppress a dark current which may occur in the photodiode 112, a voltage of 0 V to −2 V may be applied to the light shield grid 113.

The IR cut-off filter 114 is configured to prevent/reduce a photoelectric effect due to IRs out of a visible ray range and may be disposed on the planarization layer 115.

Light generated from the OLED panel 210 may be reflected by a finger and be incident on each of the pixels 110 of the image sensor 100. The light may pass through the lens 116, the IR cut-off filter 114, and the planarization layer 115. The light may be incident on the photodiode 112 via the opening 113a formed in the light shield grid 113. Light having a wavelength range corresponding to an IR range may be cut-off by the IR cut-off filter 114.

Referring to FIG. 11B, the device isolation portion DTI having a predetermined depth may be disposed between the pixels 110. The dark current suppression layer 111 may be disposed above the device isolation portion DTI and the photodiode 112. The light shield grid 113 may be disposed on the dark current suppression layer 111. The planarization layer 115 may be disposed on the light shield grid 113. The lens 116 may be disposed on the planarization layer 115. The IR cut-off filter 114 may be disposed on the lens 116.

For example, the device isolation portion DTI may be formed in the back side of the silicon substrate, and the dark current suppression layer 111 may be disposed above the device isolation portion DTI and the photodiode 112. The dark current suppression layer 111 may be integrally formed with the device isolation portion DTI. The dark current suppression layer 111 may be formed on the front (or back) side of the silicon substrate. A voltage of 0 V to −2 V is applied to the light shield grid 113 and the dark current suppression layer 111 is disposed such that generation of a dark current from the photodiode 112 may be prevented/impeded.

The dark current suppression layer 111 may be formed by stacking a plurality of layers, each of which have a fixed negative charge. Each of the plurality of layers constituting the dark current suppression layer 111 may be formed of one material or a combination of two or more materials selected from the group consisting of AlO, TaO, HfO, ZrO, and LaO.

For example, as shown in FIG. 3C, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge.

As shown in FIGS. 4A and 4B, the IR cut-off filter 114 may be constituted of a plurality of layers formed by the plurality of low refractive index films 114L having the same refractive index and the plurality of high refractive index films 114H having the same refractive index being alternately stacked.

As shown in FIGS. 4C and 4D, the IR cut-off filter 114 may be constituted of a plurality of layers formed by the plurality of high refractive index films 114H-1 to 114H-10 having different refractive indexes and the plurality of low refractive index films 114L-1 to 114L-10 having different refractive indexes being alternately stacked.

With reference to FIGS. 1 to 11B, it has been described that the IR cut-off filter 114 is incorporated into (i.e., is built-in rather than separate from) the BSI image sensor 100. The inventive concepts are not limited thereto, and the IR cut-off filter 114 of the inventive concepts may be incorporated into a front side illumination (FSI) image sensor. In addition to incorporating the IR cut-off filter 114 into the FSI image sensor, the light shield grid 113 and the light cut-off filter layer 117 of the inventive concepts may be applied to the FSI image sensor. Even in the FSI image sensor, the device isolation portion DTI and the dark current suppression layer 111 of the inventive concepts may be applied thereto. In the FSI image sensor, the dark current suppression layer 111 and the device isolation portion DTI may be integrated and formed of a plurality of layers. When the dark current suppression layer 111 and the device isolation portion DTI are integrally formed, each of the dark current suppression layer 111 and the device isolation portion DTI may be formed by stacking a plurality of layers, each of which have a fixed negative charge.

Figure 12:
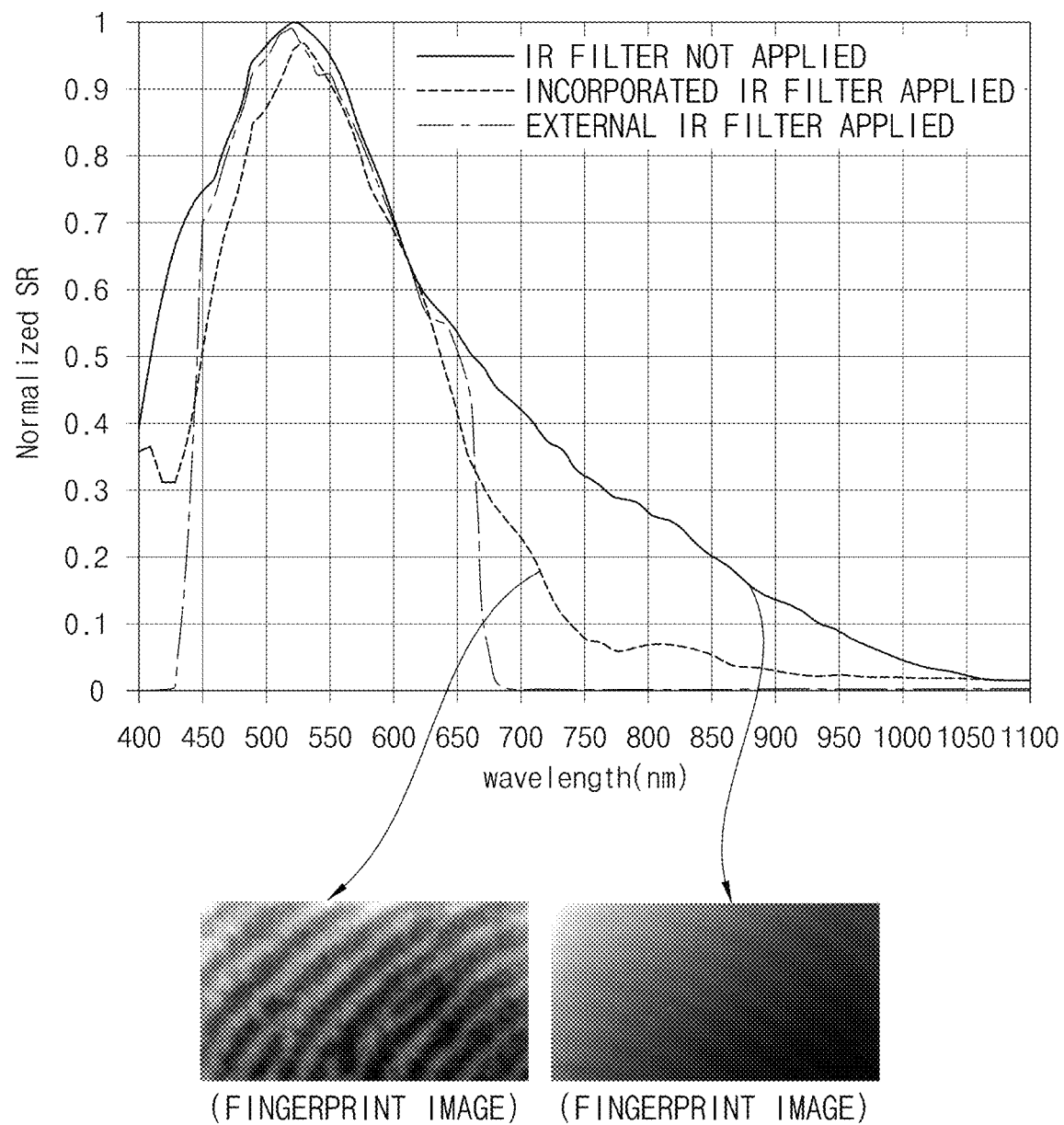
FIG. 12 is a diagram showing image degradation by comparing a case in which an IR cut-off filter is embedded in an image sensor with a case in which the IR cut-off filter is not applied to the image sensor.

FIG. 12 is a diagram showing image degradation by comparing a case in which an IR cut-off filter is embedded in an image sensor with a case in which the IR cut-off filter is not applied to the image sensor.

Referring to FIG. 12, it can be seen that the image sensor to which the IR cut-off filter is not applied causes degradation in a fingerprint image because IRs are incident on a photodiode. Even through a user touches a screen of an electronic device, an error occurs in recognizing a fingerprint due to degradation of the fingerprint image According to some example embodiments of the inventive concepts, an image sensor incorporating an IR cut-off filter can reduce degradation of a sensed fingerprint image. It is possible to generate a high-resolution fingerprint image through the image sensor such that performance of fingerprint recognition can be improved when a user touches a screen of an electronic device.

In the electronic device 10 according to some example embodiments of the inventive concepts, since the image sensor is disposed below the screen on which an image is displayed, it is not necessary to dispose a separate fingerprint sensor on a rim or a back side of the electronic device. In addition, according to some example embodiments of the inventive concepts, manufacturing efficiency of an image sensor module can be improved by incorporating the IR cut-off filter into the image sensor. Further, according to some example embodiments of the inventive concepts, a thickness and a manufacturing cost of the image sensor module can be reduced by incorporating the IR cut-off filter into the image sensor. Furthermore, according to some example embodiments of the inventive concepts, the image sensor incorporating the IR cut-off filter is applied to a cellular phone such that a thickness of the cellular phone can be reduced and a degree of design freedom in designing the cellular phone can be increased.

Additionally, according to some example embodiments of the inventive concepts, a BSI image sensor incorporating an IR cut-off filter can be provided.

According to some example embodiments of the inventive concepts, manufacturing efficiency of an image sensor module can be improved by incorporating the IR cut-off filter into the BSI image sensor.

Further, according to some example embodiments of the inventive concepts, a thickness and a manufacturing cost of the image sensor module can be reduced by incorporating the IR cut-off filter into the BSI image sensor.

Furthermore, according to some example embodiments of the inventive concepts, an electronic device including the BSI image sensor incorporating the IR cut-off filter can be provided.

Additionally, according to some example embodiments of the inventive concepts, the BSI image sensor incorporating the IR cut-off filter is applied to a cellular phone such that a thickness of the cellular phone can be reduced.

Further, according to some example embodiments of the inventive concepts, the BSI image sensor incorporating the IR cut-off filter is applied to the cellular phone such that a degree of design freedom in designing the cellular phone can be increased.

Though some example embodiments of the inventive concepts have been described with reference to the accompanying drawings, it will be understood by those skilled in the art that various modifications may be made without departing from the scope of the inventive concepts. Therefore, the above-described example embodiments should be considered in a descriptive sense only and not for purposes of limitation.

What is claimed is:

1. A back side illumination (BSI) image sensor comprising:
    a substrate; and
    a plurality of pixels configured to generate electrical signals responsive to light incident on the substrate,
    wherein each of the plurality of pixels comprises:
    a photodiode;
    a device isolation region around the photodiode;
    a dark current suppression layer above the photodiode;
    an infrared radiation (IR) cut-off filter above the photodiode;
    a light shield pattern above the photodiode and comprising an opening corresponding to an area of 1 to 15% of each of the plurality of pixels;
    a light cut-off filter layer on the light shield pattern except for the opening;

a planarization layer on the light cut-off filter layer; and
a lens on the planarization layer.

2. The BSI image sensor of claim 1, wherein the device isolation region and the dark current suppression layer collectively comprise an integrated stack of a plurality of layers that each have a negative charge.

3. The BSI image sensor of claim 1, wherein the opening of the light shield pattern is in a central portion of each of the plurality of pixels.

4. The BSI image sensor of claim 1, wherein the IR cut-off filter is between the photodiode and the light shield pattern.

5. The BSI image sensor of claim 1, wherein the IR cut-off filter is between the light shield pattern and the planarization layer.

6. The BSI image sensor of claim 1, wherein:
the planarization layer comprises a first planarization layer on the light shield pattern and a second planarization layer on the first planarization layer; and
the IR cut-off filter is between the first planarization layer and the second planarization layer.

7. The BSI image sensor of claim 1, wherein the IR cut-off filter is between the planarization layer and the lens.

8. The BSI image sensor of claim 1, wherein the IR cut-off filter is on the lens.

9. The BSI image sensor of claim 1,
wherein the IR cut-off filter comprises a plurality of refractive index films comprising:
a plurality of first refractive index films having a first refractive index; and
a plurality of second refractive index films having a second refractive index that is higher than the first refractive index, and
wherein the plurality of first refractive index films are alternately stacked with the plurality of second refractive index films.

10. The BSI image sensor of claim 9, wherein:
each of the plurality of first refractive index films has a refractive index of 1.2 to 1.8, and
each of the plurality of second refractive index films has a refractive index of 2.0 to 2.8.

11. The BSI image sensor of claim 1, wherein:
the IR cut-off filter comprises a stack of a plurality of refractive index films,
first ones of the plurality of refractive index films comprising odd-numbered layers of the stack have different refractive indexes of 1.2 to 1.8; and
second ones of the plurality of refractive index films comprising even-numbered layers of the stack have different refractive indexes of 2.0 to 2.8.

12. The BSI image sensor of claim 1, wherein:
the IR cut-off filter comprises a stack of a plurality of refractive index films,
first ones of the plurality of refractive index films comprising odd-numbered layers of the stack have different refractive indexes of 2.0 to 2.8; and
second ones of the plurality of refractive index films comprising even-numbered layers of the stack have different refractive indexes of 1.2 to 1.8.

13. The BSI image sensor of claim 1, wherein the IR cut-off filter is between the light shield pattern and the light cut-off filter layer.

14. The BSI image sensor of claim 1, wherein the light shield pattern is between the IR cut-off filter and the light cut-off filter layer.

15. A back side illumination (BSI) image sensor comprising:
a substrate; and
a plurality of pixels configured to generate electrical signals responsive to light incident on a back side of the substrate,
wherein each of the plurality of pixels comprises:
a photodiode;
a dark current suppression layer above the photodiode and comprising a stack of a plurality of layers that each have a negative charge;
an infrared radiation (IR) cut-off filter above the photodiode and comprising a stack of a plurality of refractive index films;
a light shield pattern above the photodiode and comprising an opening corresponding to an area of 1 to 15% of each of the plurality of pixels;
a planarization layer on the light shield pattern; and
a lens on the planarization layer.

16. The BSI image sensor of claim 15, wherein the IR cut-off filter is between the photodiode and the light shield pattern.

17. The BSI image sensor of claim 15, wherein the IR cut-off filter is above the light shield pattern.

18. The BSI image sensor of claim 15, wherein:
the planarization layer comprises a first planarization layer on the light shield pattern and a second planarization layer on the first planarization layer; and
the IR cut-off filter is between the first planarization layer and the second planarization layer.

19. A back side illumination (BSI) image sensor comprising:
a substrate;
a plurality of pixels configured to generate electrical signals responsive to light incident on a back side of the substrate; and
a plurality of readout circuits configured to readout the electrical signals of the plurality of pixels,
wherein each of the plurality of pixels comprises:
a photodiode;
an infrared radiation (IR) cut-off filter above the photodiode;
a light shield pattern above the photodiode and comprising an opening corresponding to an area of 1 to 15% of each of the plurality of pixels;
a planarization layer on the light shield pattern; and
a lens on the planarization layer.

20. The BSI image sensor of claim 19, wherein the opening of the light shield pattern overlaps the photodiode.

* * * * *